(12) United States Patent
Lin et al.

(10) Patent No.: US 12,320,511 B2
(45) Date of Patent: Jun. 3, 2025

(54) LAMP POWER ADAPTER

(71) Applicant: Changzhou Jutai Electronics Co., Ltd., Jiangsu (CN)

(72) Inventors: Jun Lin, Jiangsu (CN); Chengqian Pan, Jiangsu (CN); Wei Huang, Jiangsu (CN); Jin Chen, Jiangsu (CN)

(73) Assignee: Changzhou Jutai Electronics Co., Ltd., Changzhou (CN)

( * ) Notice: Subject to any disclaimer, the term of this patent is extended or adjusted under 35 U.S.C. 154(b) by 403 days.

(21) Appl. No.: 17/942,599

(22) Filed: Sep. 12, 2022

(65) Prior Publication Data

US 2024/0019113 A1 Jan. 18, 2024

(30) Foreign Application Priority Data

Jul. 12, 2022 (CN) .......................... 202221793672.9

(51) Int. Cl.
*F21V 23/02* (2006.01)
*H01R 31/06* (2006.01)

(52) U.S. Cl.
CPC ........... *F21V 23/02* (2013.01); *H01R 31/065* (2013.01)

(58) Field of Classification Search
CPC ............................. H01R 31/065; F21V 23/02

USPC .................. 439/638, 620.22, 620.25, 620.24
See application file for complete search history.

(56) References Cited

U.S. PATENT DOCUMENTS

| | | | |
|---|---|---|---|
| 8,337,250 B1* | 12/2012 | Yang ..................... | H01R 13/112 439/620.22 |
| 2008/0123376 A1* | 5/2008 | Ho ......................... | H01R 27/00 363/74 |
| 2015/0311656 A1* | 10/2015 | Lai ........................ | H01R 31/065 439/620.22 |
| 2019/0094935 A1* | 3/2019 | Ng ........................ | G06F 13/4282 |

\* cited by examiner

*Primary Examiner* — Gary F Paumen

(57) ABSTRACT

The disclosure discloses A lamp power adapter, comprising an input conductive component, a shell, a circuit board an end cover and a connecting base for connecting load; one end of the input conductive component is located in the shell, the input conductive component is integrally fixed with the shell, the other end of the input conductive component is exposed outside the shell, an input connecting terminal, a control circuit and an output connecting terminal are arranged on the circuit board, at least a part of the circuit board is located in the shell, the input connecting terminal is electrically connected to one end of the input conductive component, the connecting base is arranged on the end cover, an output conductive component is arranged on the connecting base, when the end cover fits with the shell, the output conductive component is in plugging fit with the output connecting terminal.

7 Claims, 45 Drawing Sheets

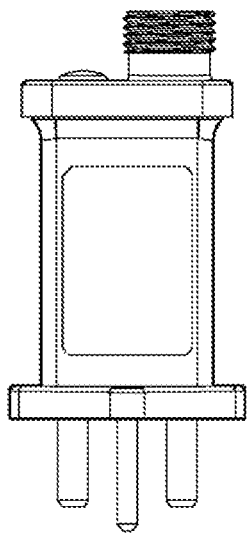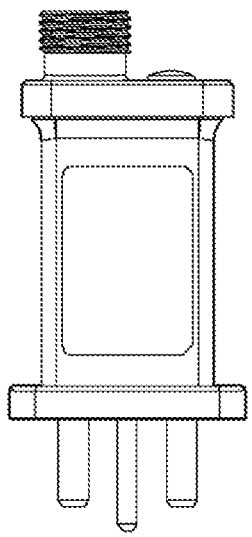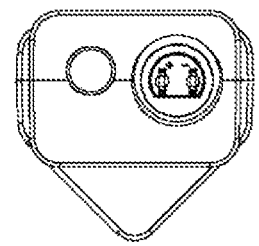
FIG.38a  FIG.38b  FIG.38e
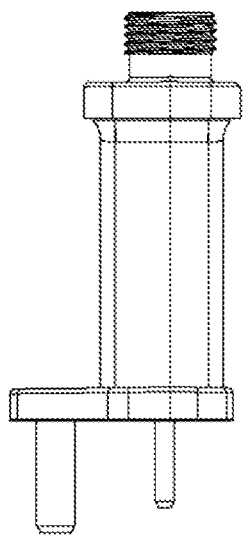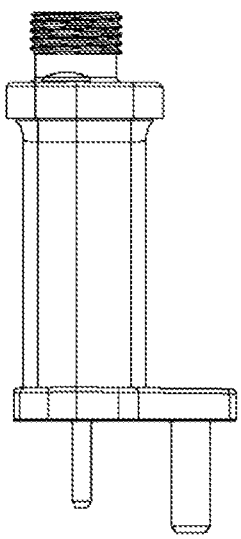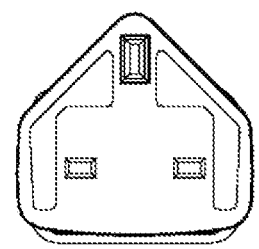
FIG.38c  FIG.38d  FIG.38f

LAMP POWER ADAPTER

CROSS-REFERENCE TO RELATED APPLICATION

This application claims priority from the Chinese patent application 2022217936729 filed Jul. 12, 2022, the content of which is incorporated herein in the entirety by reference.

TECHNICAL FIELD

The disclosure relates to the technical field of power conversion, in particular to a lamp power adapter.

BACKGROUND

An existing power adapter is usually composed of an input conductive component, a shell, a circuit board, an end cover and a connecting base for connecting load. One end of the input conductive component is located in the shell, the input conductive component is integrally fixed with the shell, and the other end of the input conductive component is exposed outside the shell and connected to a socket for high-voltage alternating current. An input connecting terminal, a control circuit and an output connecting terminal are arranged on the circuit board, at least a part of the circuit board is located in the shell, the input connecting terminal is electrically connected to one end of the input conductive component, the connecting base is arranged on the end cover, an output conductive component is arranged on the connecting base, and when the end cover fits with the shell, the output conductive component is in plugging fit with the output connecting terminal. The load is composed of a wire and a plurality of LED lamps connected to the wire, and the plurality of LED lamps arranged on the wire form a lamp luster.

Usually, two output connecting terminals are arranged for the power adapter with the above structure, and two output conductive components fitting with the output connecting terminals are provided, meaning that the output conductive components can only connect to two wires when the load is connected to the output connecting terminals. If one lamp luster is arranged on each wire, the quantity of the lamp luster connected to the existing power adapter is less, and the light effect produced by the lamp is decided by the quantity of the lamp luster; and if the quantity of the connected lamp luster is more, more light effects can be changed. Therefore, the power adapter with the above structure enables the light effect to be limited during work.

When the circuit board is inserted into the shell, due to specified space height inside the shell, usually two ribs are respectively arranged on two opposite inner walls of the shell, and a slot is formed between the two ribs. The circuit board moves along the slot, after the circuit board is installed, the ribs play a role in supporting and limiting the circuit board, and then the length of the existing ribs is equivalent to that of the circuit board, or the length of the ribs is slightly less than that of the circuit board, for example, the length of the ribs is 64 mm, and the length of the circuit board is 66 mm. The existing four ribs are set as the above length, resulting in more materials required during injection molding, and increasing shell cost.

SUMMARY

The disclosure provides a lamp power adapter, and the disclosure has the characteristics of expanding the connected lamp and reducing the cost.

A lamp power adapter, comprising an input conductive component, a shell, a circuit board an end cover and a connecting base for connecting load; one end of the input conductive component is located in the shell, the input conductive componentis integrally fixed with the shell, the other end of the input conductive component is exposed outside the shell, an input connecting terminal, a control circuit and an output connecting terminal are arranged on the circuit board, at least a part of the circuit board is located in the shell, the input connecting terminalis electrically connected to one end of the input conductive component, the connecting base is arranged on the end cover, an output conductive component is arranged on the connecting base, when the end cover fits with the shell, the output conductive component is in plugging fit with the output connecting terminal, wherein the output connecting terminal comprises a first output connecting terminal, a second output connecting terminal and a third output connecting terminal, and the output conductive component comprises a first conductive component plugged with the first output connecting terminal, a second conductive component plugged with the second output connecting terminal and a third conductive component plugged with the third output connecting terminal, wherein:

the first output connecting terminal, the second output connecting terminal and the third output connecting terminal are arranged side by side; or the first output connecting terminal is misaligned with the second output connecting terminal, and the second output connecting terminal is misaligned with the third output connecting terminal.

In this embodiment, the lamp luster connected to the output conductive component can be expanded to three lusters by expanding the quality of the output connecting terminal and the output conductive component, so that the work time of each circuit of lamp luster may be controlled, and different work time may show different lighting effects. Moreover, the disclosure is respectively connected to the output conductive component through three wires, at least four circuits of LED lamp lusters are also connected among the three wires, apparently, the showed lighting effect is better than that in the prior art. The controller structure and the circuit structure are simpler in a case that the circuit quantity connected to the lamp is more than that in the prior art, so that the cost will not be increased.

BRIEF DESCRIPTION OF THE DRAWINGS

FIG. 2b is a sectional view along an A-A line in FIG. 2a.

FIG. 30a to FIG. 31f are respectively orthographic views of six surfaces of an appearance of a twentieth lamp controller.

FIG. 31a to FIG. 31f are respectively orthographic views of six surfaces of an appearance of a twenty-first lamp controller.

FIG. 38a to FIG. 38f are respectively orthographic views of six surfaces of an appearance of a twenty-eighth lamp controller.

DETAILED DESCRIPTION OF THE EMBODIMENTS

Figure 1A:
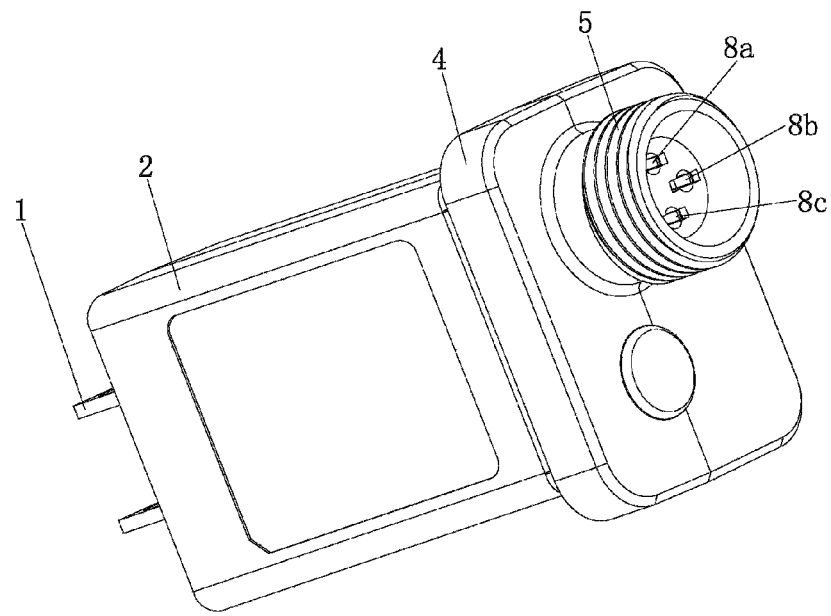
FIG. 1a is a solid diagram of a first lamp power adapter in the disclosure.
Figure 1B:
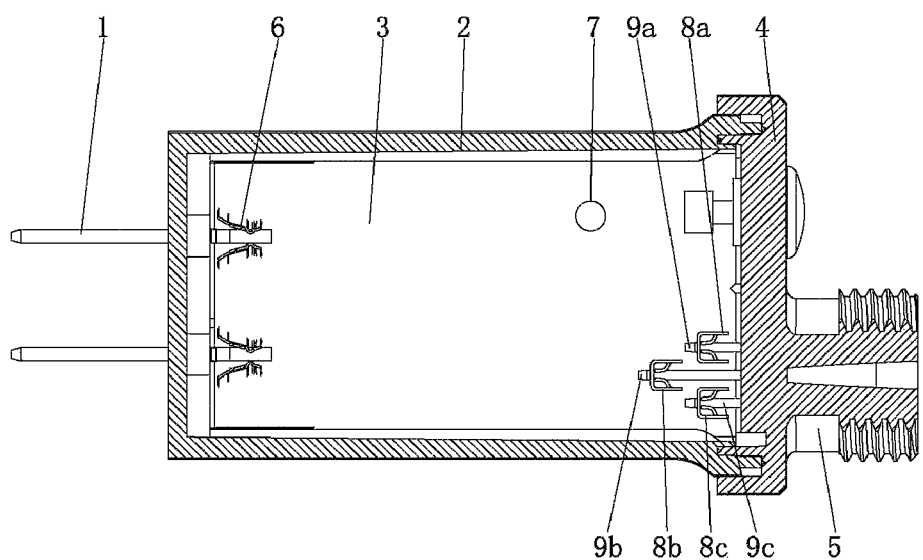
FIG. 1b is a profile of a first lamp power adapter in the disclosure.
Figure 1C:
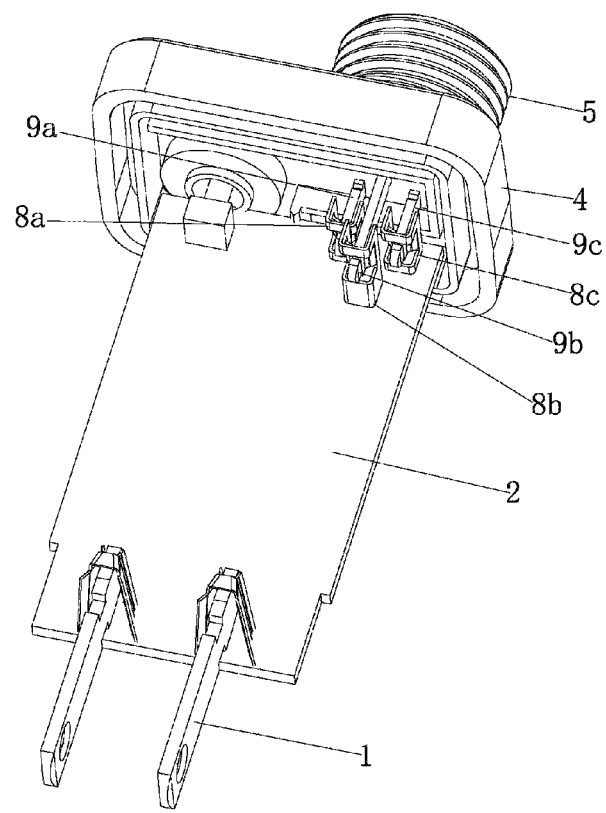
FIG. 1c is a solid diagram that a circuit board fits with an end part in a first lamp power adapter.
Figure 1D:
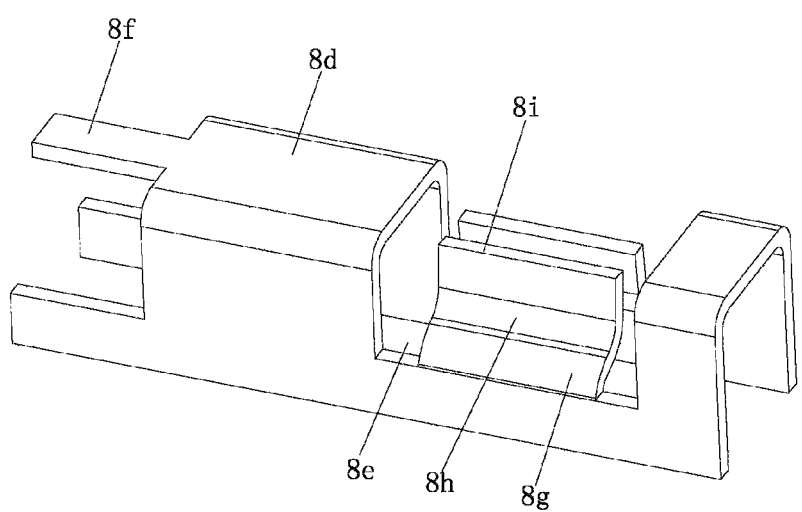
FIG. 1d is a solid diagram of a first output connecting terminal.
Figure 1E:
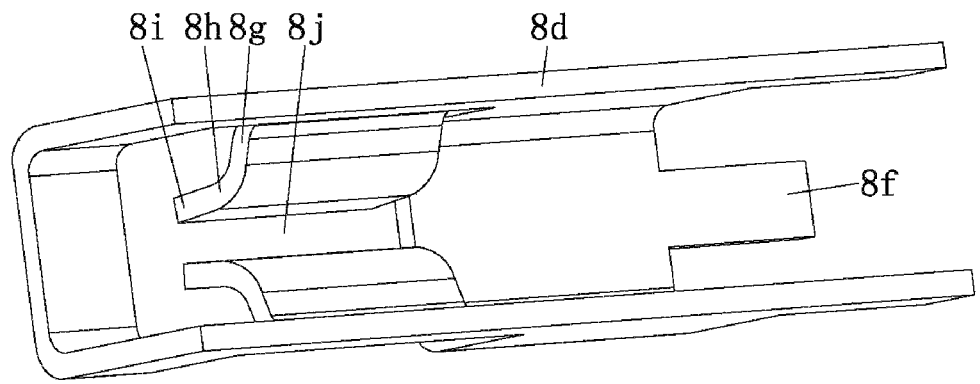
FIG. 1e is a solid diagram of a first output connecting terminal in another direction.
Figure 1F:
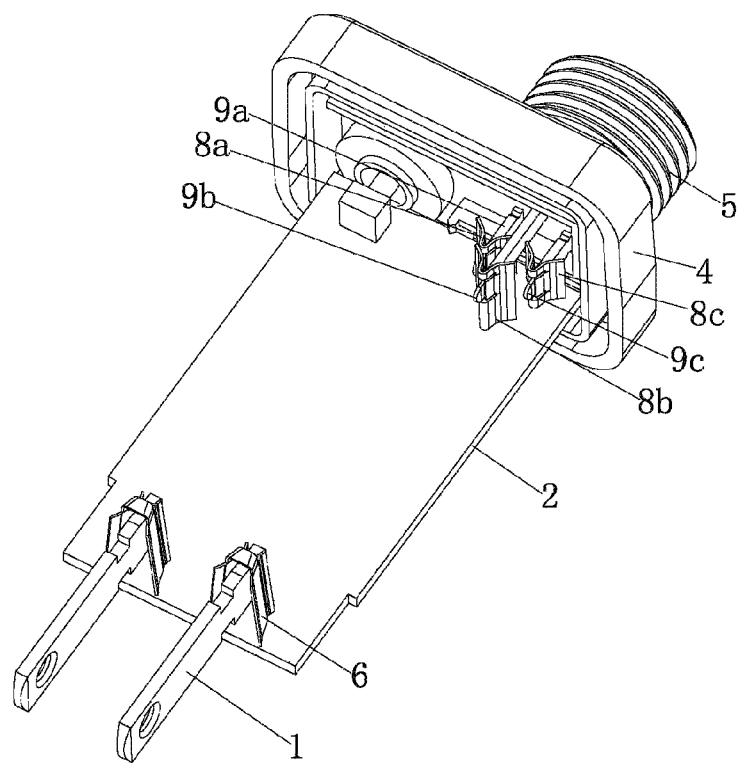
FIG. 1f is a deformation structure diagram of a first lamp power adapter.
Figure 1G:
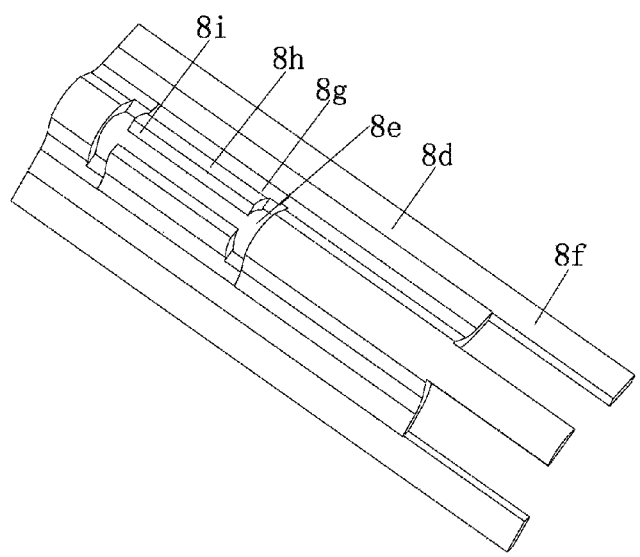
FIG. 1g is a deformation structure diagram of a first output connecting terminal.
Figure 1H:
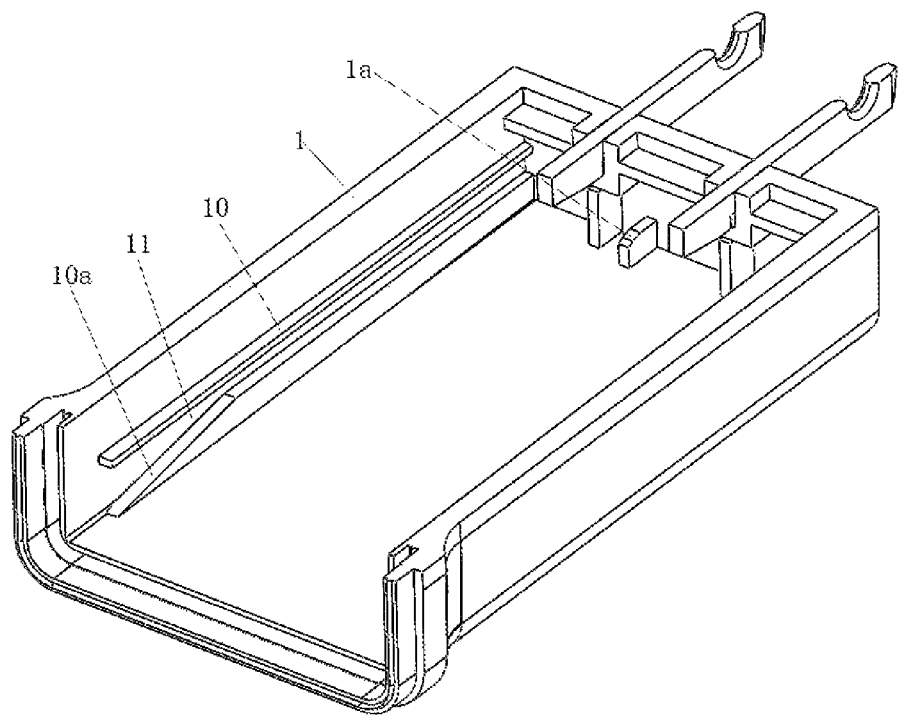
FIG. 1h is a profile of a shell in a first lamp power adapter.

The disclosure is further described in combination with drawings and specific implementation modes below.

Embodiment 1

As shown in FIG. 1a to FIG. 3b, the lamp power adapter provided by the disclosure includes an input conductive component 1, a shell 2, a circuit board 3, an end cover 4 and a connecting base 5 for connecting load, one end of the input conductive component 1 is located in the shell 2, the input conductive component 1 is integrally fixed with the shell 2, and the other end of the input conductive component 1 is exposed outside the shell 2 and connected to a socket for high-voltage alternating current.

As shown in FIG. 1a to FIG. 3b, an input connecting terminal 6, a control circuit 7 and an output connecting terminal are arranged on the circuit board 3, at least a part of the circuit board 3 is located in the shell 2, and the input connecting terminal 6 is electrically connected to one end of the input conductive component 1. In this embodiment, the input connecting terminal 6 is fixedly welded with the circuit board 3, a conductive clamping part is arranged on the input connecting terminal 6, and the input conductive component 1 is in plugging fit with the conductive clamping part on the input connecting terminal 6. The control circuit 7 is configured to convert alternating current into direct current, to be used by a load lamp. At the same time, the control circuit 7 controls the light-emitting mode of the lamp, for example, outputs a signal with different duty cycles to control the turn-on and turn-off time of each circuit of lamp luster, thereby showing different light effects.

As shown in FIG. 1a to FIG. 3b, the connecting base 5 is arranged on the end cover 4, the output conductive component is arranged on the connecting base 5, and when the end cover 4 fits with the shell 2, the output conductive component is in plugging fit with the output connecting terminal. In this embodiment, three output connecting terminals are provided, namely, the output connecting terminal includes a first output connecting terminal 8a, a second output connecting terminal 8b and a third output connecting terminal 8c, and in this embodiment, three output conductive components are also provided, namely, the output conductive component includes a first conductive component 9a plugged with the first output connecting terminal 8a, a second conductive component 9b plugged with the second output connecting terminal 8b and a third conductive component 9c plugged with the third output connecting terminal 8c.

Figure 2A:
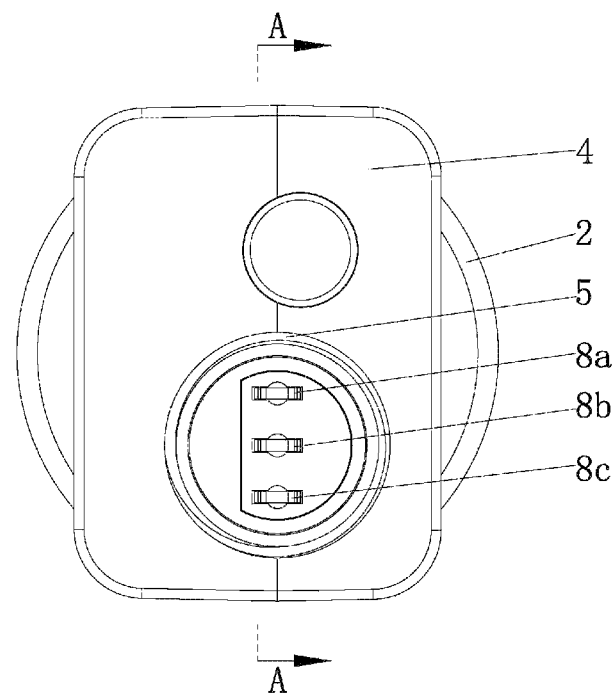
FIG. 2a is a schematic diagram of a second lamp power adapter in the disclosure.
Figure 2B:
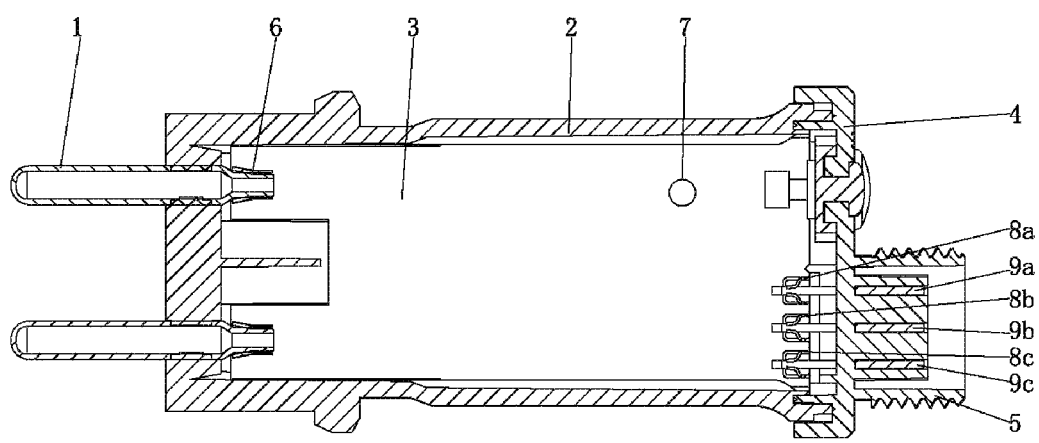
Figure 2C:
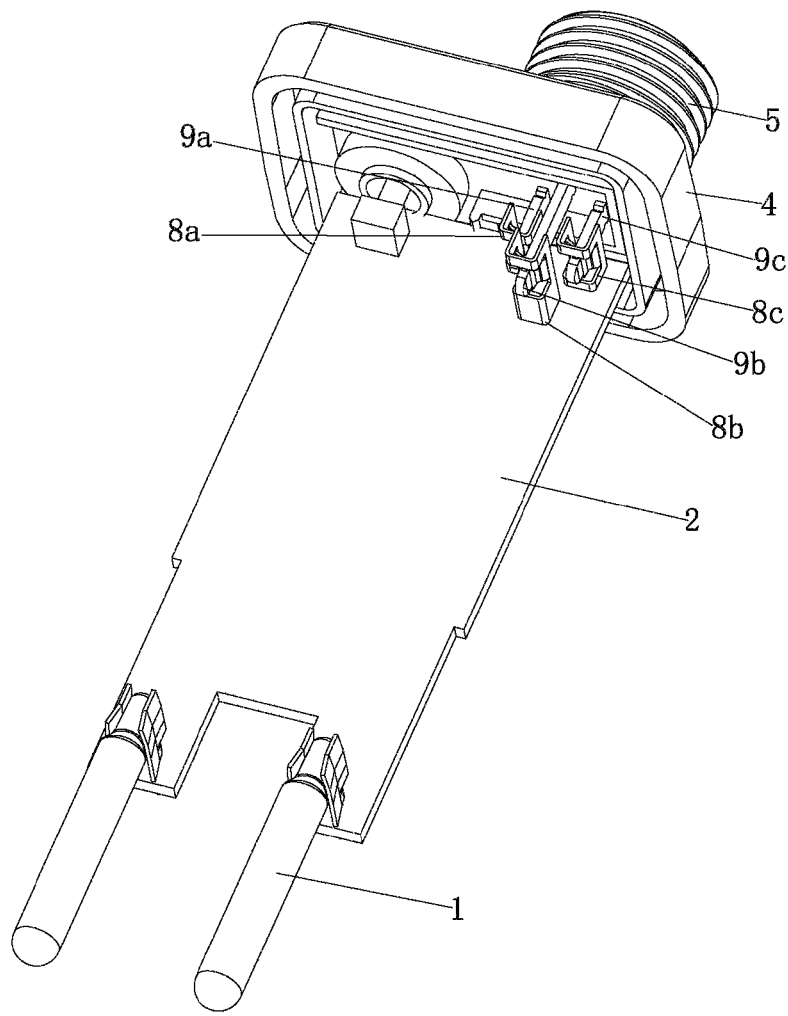
FIG. 2c is a solid diagram that a circuit board fits with an end part in a second lamp power adapter.
Figure 2D:
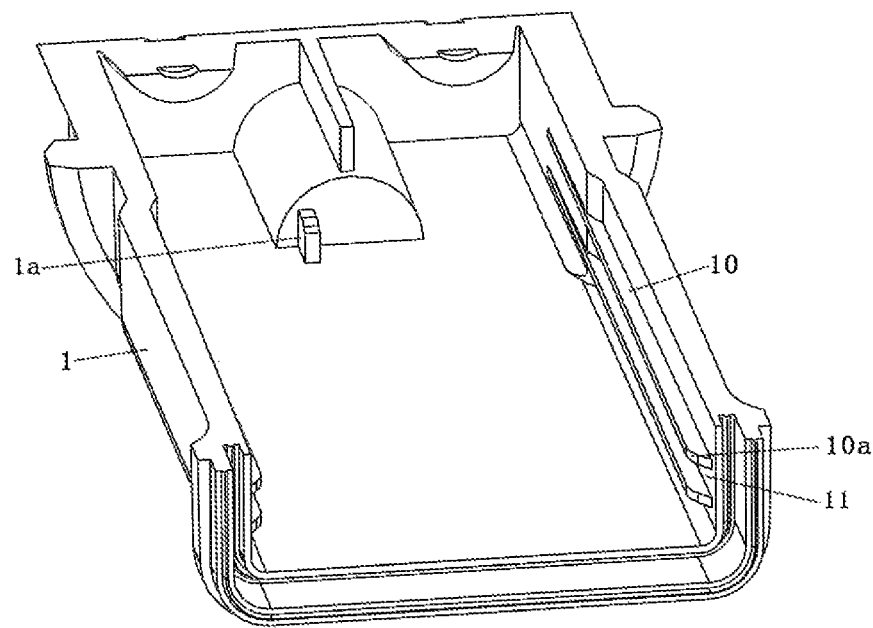
FIG. 2d is a profile of a shell in a second lamp power adapter.
Figure 2E:
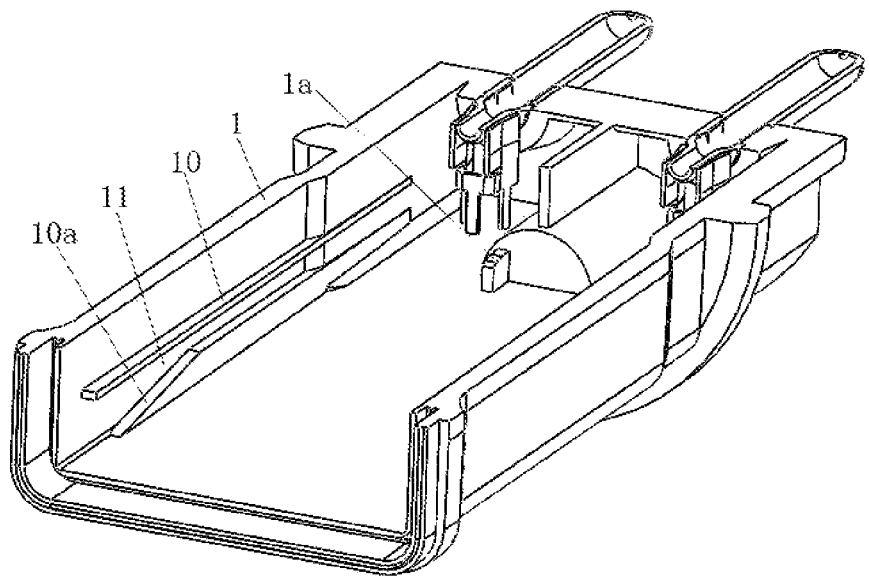
FIG. 2e is a deformation schematic diagram of a rib of a shell in a second lamp power adapter.
Figure 3A:
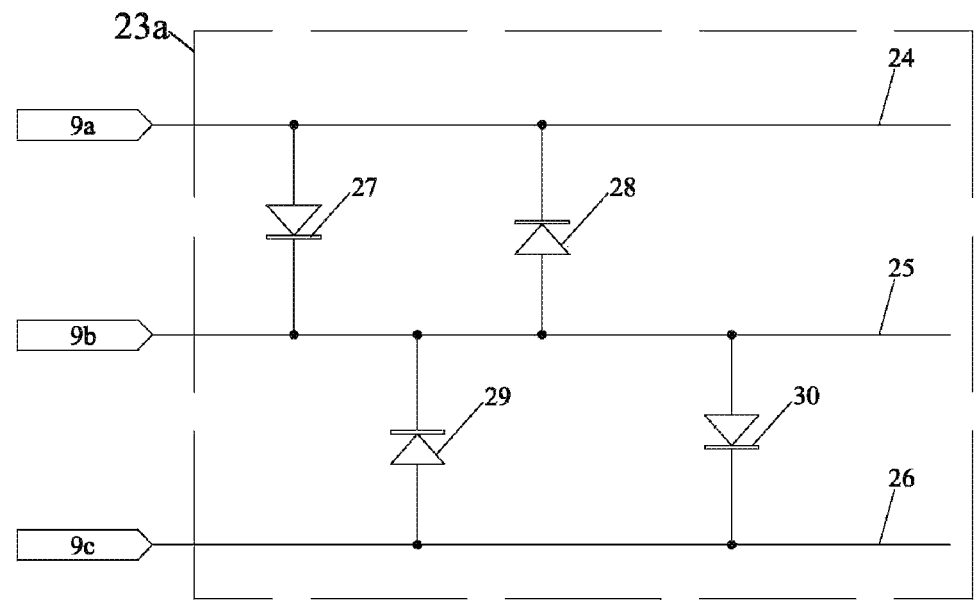
FIG. 3a is a wiring diagram of a three-wire and four-circuit lamp and a lamp power adapter in the disclosure.
Figure 3B:
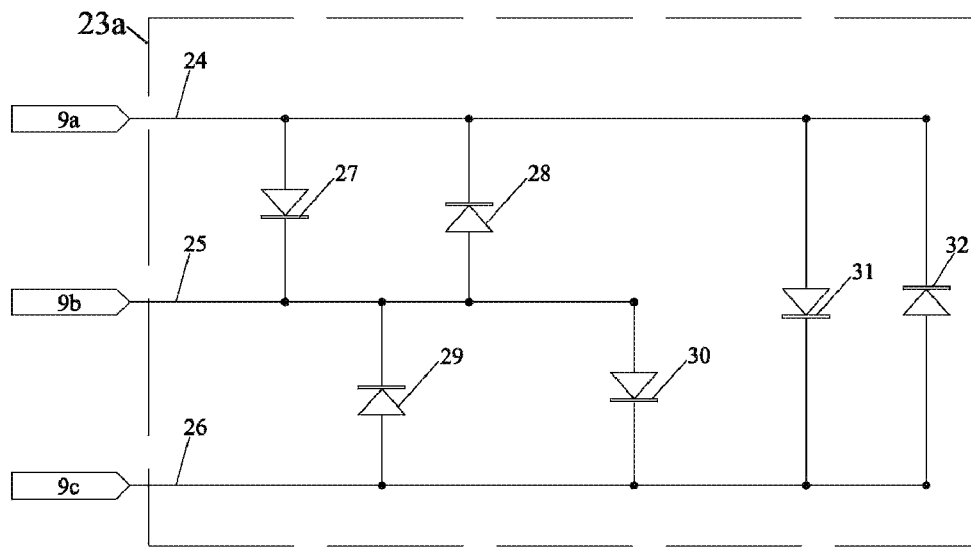
FIG. 3b is a wiring diagram of a three-wire and six-circuit lamp and a lamp power adapter in the disclosure.

As shown in FIG. 1a to FIG. 3b, in this embodiment, the lamp luster connected to the output conductive component can be expanded to three lusters by expanding the quality of the output connecting terminal and the output conductive component, so that the work time of each circuit of lamp luster may be controlled, and different work time may show different lighting effects. Moreover, the disclosure is respectively connected to the output conductive component through three wires, at most six circuits of LED lamp lusters (as shown in FIG. 3b) are also connected among the three wires, apparently, the showed light effect is better than that in the prior art. The controller structure and the circuit structure are simpler in a case that the circuit quantity connected to the lamp is more than that in the prior art, so that the cost will not be increased.

As shown in FIG. 1a to FIG. 3b, the expanded output connecting terminal may be arranged by any one of the following ways:

(1) The first output connecting terminal 8a, the second output connecting terminal 8b and the third output connecting terminal 8c are arranged side by side, and the output conductive component includes the first conductive component 9a, the second conductive component 9b and the third conductive component 9c, which are arranged side by side.

(2) The first output connecting terminal 8a is misaligned with the second output connecting terminal 8b, the second output connecting terminal 8b is misaligned with the third output connecting terminal 8c, the first output connecting terminal 8a and the third output connecting terminal 8c are arranged side by side, the first conductive component 9a is misaligned with the second conductive component 9b, the second conductive component 9b is misaligned with the third conductive component 9c, and the first conductive component 9a and the third conductive component 9c are arranged side by side.

(3) The first output connecting terminal 8a is misaligned with the second output connecting terminal 8b, the second output connecting terminal 8b is misaligned with the third output connecting terminal 8c, the first output connecting terminal 8a and the third output connecting terminal 8c are arranged side by side, and the first conductive component 9a, the second conductive component 9b and the third conductive component 9c are arranged side by side.

(4) The first output connecting terminal 8a is misaligned with the second output connecting terminal 8b, the second output connecting terminal 8b is misaligned with the third output connecting terminal 8c, the first output connecting terminal 8a is misaligned with the third output connecting terminal 8c, the first conductive component 9a is misaligned with the second conductive component 9b, the second conductive component 9b is misaligned with the third conductive component 9c, and the first conductive component 9a is misaligned with the third conductive component 9c.

As shown in FIG. 1a to FIG. 3b, in this embodiment, the first output connecting terminal 8a, the second output connecting terminal 8b and the third output connecting terminal 8c include conductive bodies 8d with openings, welding pins 8f and two symmetrically arranged clamping sheets for clamping the output conductive components, abdicating openings 8e are arranged on the conductive bodies 8d, and the welding pins 8f are fixed with the conductive bodies 8d; the two clamping sheets include first bending parts 8g, second bending parts 8h and clamping parts 8i, one end of each first bending part 8g is located in each abdicating opening 8e and fixed with each conductive body 8d; after the other end of each first bending part 8g is fixed with one end of each second bending part 8h, an inserting import opening 8j is formed between the two second bending parts 8h; and the other end of each second bending part 8h is fixed with each clamping part 8i. A bending direction of each first bending part 8g is opposite to that of each second bending part 8h.

As shown in FIG. 1a to FIG. 3b, the clamping sheets with the above structures are transited to the clamping parts 8i through the first bending parts 8g and the second bending parts 8h. When the output conductive component is inserted between the two clamping parts 8i with the structures, the clamping sheets may be prevented from being broken, or the situation that the clamping sheets cannot be reset after being expanded and deformed by the output conductive component may be avoided. Therefore, the clamping sheets guarantee the quality of the output connecting terminal through the transition of the two bending parts.

As shown in FIG. 1a to FIG. 3b, in this embodiment, the first conductive component 9a, the second conductive component 9b and the third conductive component 9c optimize Y-shaped structures, and one end with the opening of the first conductive component 9a, the second conductive component 9b and the third conductive component 9c is configured to connect to the load lamp.

As shown in FIG. 1a to FIG. 3b, in this embodiment, two ribs 10 are respectively arranged on the two opposite inner walls of the shell 1, a slot 11 is formed between the two ribs 10, and the length of each rib 10 is less than or equal to that of the circuit board 3. In this embodiment, for example, the length of each rib 10 is 60%-75% of that of the circuit board 3, and in this embodiment, the length of each rib 10 is 70% of that of the circuit board 3. In this embodiment, the material required for injecting the ribs 10 can be reduced by shortening the length of each rib 10, thereby reducing the product cost.

As shown in FIG. 1a to FIG. 3b, after the length of each rib 10 is shortened, supporting points obtained by the circuit board 3 are reduced, but not affecting the stability of the circuit board 3 in the shell. In order to support the circuit board 3 well, a supporting part 1a for supporting the circuit board 3 is arranged on the inner wall of the shell 1, the position of the supporting part 1a is preferentially located at a part corresponding to the end part of the circuit board 3, and in this embodiment, one supporting part 1a is arranged. A plurality of supporting parts 1a may be arranged according to needs.

As shown in FIG. 2d, in order to insert the circuit board 3 into the slot 11 conveniently, a chamfer 10a is arranged at the end part of each rib 10 corresponding to the entrance of the slot 11. When the circuit board 3 is inserted into the slot 11, the interference between the circuit board 3 and the ribs 10 may be reduced through the chamfer 10a, thereby improving the smoothness for inserting the circuit board 3 into the slot 11. The chamfer 10a may be a round corner or an oblique corner.

Figure 4:
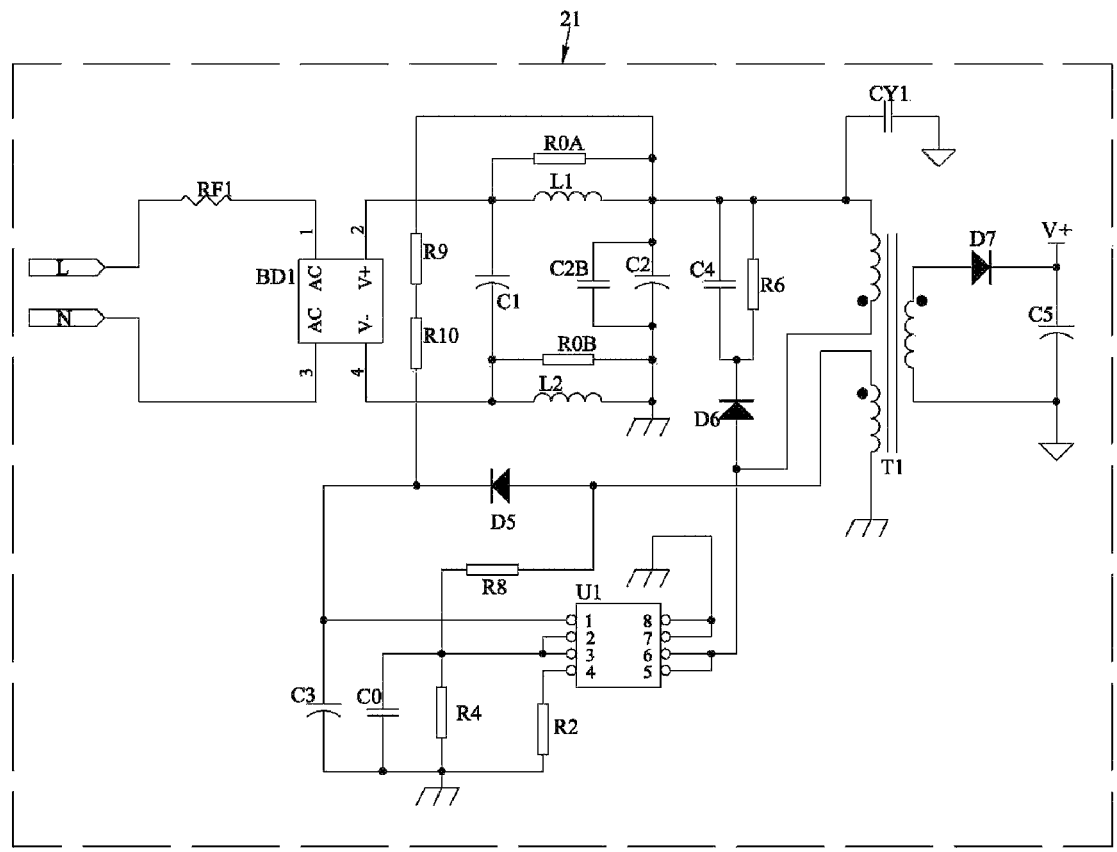
FIG. 4 is a schematic diagram of a DC power supply.
Figure 5:
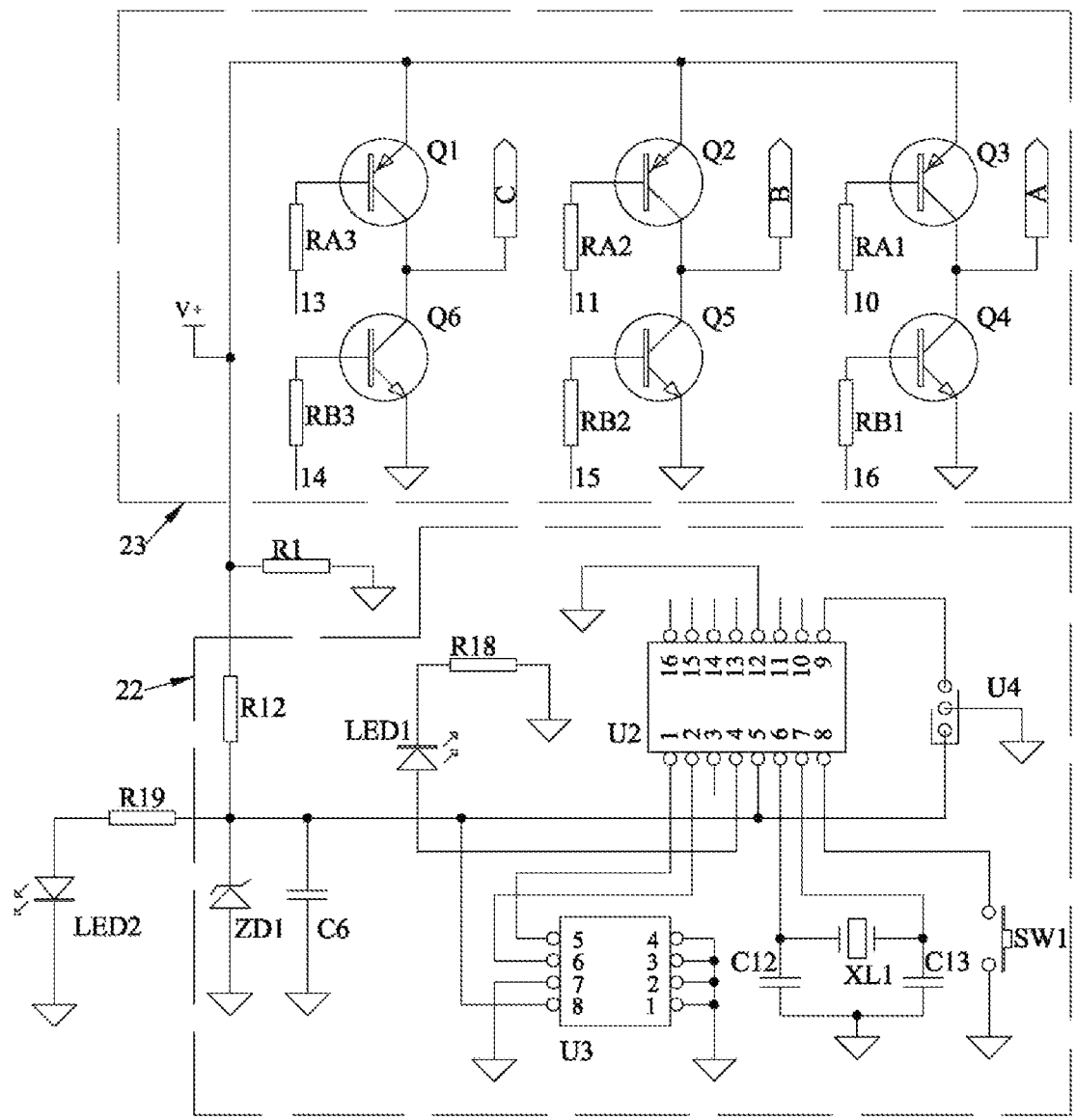
FIG. 5 is a schematic diagram of a first control unit and a switch unit in the disclosure.

As shown in FIG. 4 to FIG. 5, in this embodiment, the control circuit 7 includes a DC power supply 21, a control unit 22 and a switch unit 23, an output end of the DC power supply 21 is electrically connected to the control unit 22 and the switch unit 23 in respective, the DC power supply 21 may adopt a battery or a switch power supply, and in this embodiment, the switch power supply for converting the alternating current to the direct current is preferentially adopted. In this embodiment, the switch power supply includes a rectifier filter circuit, a voltage conversion circuit, a starting circuit and a switch control circuit. Each part of the switch power supply is described in details below:

As shown in FIG. 4, an output end of the rectifier filter circuit is respectively connected to the voltage conversion circuit and the starting circuit, the rectifier filter circuit includes a single-phase full-wave rectifier circuit BD1, first inductance L1, a first capacitor C1, a second capacitor C2, a second parallel capacitor C2B, second inductance L2, a first anti-interference resistor ROA and a second anti-interference resistor ROB, and the single-phase full-wave rectifier circuit is composed of four diodes; an anode output end of the single-phase full-wave rectifier circuit BD1 is respectively connected to one end of the first inductance L1 and one end of the first capacitor C1, the first anti-interference resistor ROA is connected to the two ends of the first inductance L1 in parallel, the other end of the first inductance L1 is connected to one end of the second capacitor C2, the other end of the second capacitor C2 is grounded, the second parallel capacitor C2B is connected to the two ends of the second capacitor C2 in parallel, the other end of the first capacitor C1 is connected to a cathode output end of the single-phase full-wave rectifier circuit BD1, the other end of the first capacitor C1 is also connected to one end of the second inductance L2, the other end of the second inductance L2 is grounded, and the second anti-interference resistor ROB is connected to the two ends of the second inductance L2 in parallel.

As shown in FIG. 4, after being provided to the single-phase full-wave rectifier circuit BD1 for rectifying through a fuse RF1, alternating current voltage is filtered through the first inductance L1, the first capacitor C1, the second capacitor C2 and the second parallel capacitor C2B, and then electromagnetic interference is eliminated through an electromagnetic anti-interference circuit formed by the first inductance L1, the first anti-interference resistor ROA, the second inductance L2 and the second anti-interference resistor ROB, thereby avoiding the influence of an electromagnetic interference signal on output DC voltage. The direct current obtained through the rectifier filter circuit is conveyed to the voltage conversion circuit, and the voltage conversion circuit is a transformer T1, which can transform high voltage into low voltage, to be used by the follow-up control unit 22 and the switch unit 23. The transformer T1 and the first inductance L1 are provided with safety capacitors CY1, and one end of the safety capacitor CY1 is connected to the ground.

As shown in FIG. 4, the switch power supply further includes a rectifier diode D7 and a fifth capacitor C5, an anode end of the rectifier diode D7 is connected to an output end of the voltage conversion circuit, a cathode end of the rectifier diode D7 is connected to one end of the fifth capacitor C5, and the other end of the fifth capacitor C5 is grounded. After secondary output voltage of the transformer T1 is rectified through the rectifier diode D, direct current voltage is obtained, namely, an output end V+ of the DC power supply 21, and the direct current voltage charges the fifth capacitor C5.

As shown in FIG. 4, the starting circuit includes a first current-limiting resistor R9 and a second current-limiting resistor R10, one end of the first current-limiting resistor R9 is connected to the other end of the first inductance L1 while the other end of the first current-limiting resistor R9 is connected to one end of the second current-limiting resistor R10, and the other end of the second current-limiting resistor R10 is electrically connected to the switch control circuit.

As shown in FIG. 4, the switch control circuit is electrically connected to the rectifier filter circuit and the voltage conversion circuit in respective. The switch control circuit includes a power control chip U1, a second resistor R2, a third capacitor C3, a first voltage sampling resistor R8, a second voltage sampling resistor R4 and a voltage sampling filter capacitor C0, an output end of the power control chip U1 is connected to the transformer T1, and the power control chip U1 is grounded through the second resistor R2. One end of the third capacitor C3 is respectively connected to the other end of the second current-limiting resistor R10 and the power control chip U1, the other end of the third capacitor C3 is grounded, an auxiliary winding of the transformer T1 is connected to the third capacitor C3 through a fifth diode D5, one end of the first voltage sampling resistor R8 is connected to the auxiliary winding of the transformer T1, and the other end of the first voltage sampling resistor R8 is respectively connected to the second voltage sampling resistor R4 and the power control chip U1.

As shown in FIG. 4, during the initial power-on period of the switch power supply, the current output by the rectifier filter circuit is provided to the third capacitor C3 after being limited through the first current-limiting resistor R9 and the second current-limiting resistor R10, so as to charge the third capacitor C3; the voltage released by the third capacitor C3 is provided to the power control chip U1, and the power control chip U1 is powered on to work, so the switch control circuit is started to work. An electrical signal of a primary winding of the transformer T1 is provided to the power control chip U1 after being sampled through the first voltage sampling resistor R8 and the second voltage sampling resistor R4, the power control chip U1 compares the electrical signal with an output voltage value set inside the power control chip U1, and if the electrical signal is unequal to the output voltage value, the power control chip U1 will output a control signal to adjust the output voltage. A power tube is integrated inside the power control chip U1, and the power control chip U1 adjusts the output voltage by controlling the time for turning on or turning off the power tube.

As shown in FIG. 4, a negative peak absorption circuit is also connected between the switch control circuit and the transformer T1, the negative peak absorption circuit includes a fourth capacitor C4, a sixth resistor R6 and a sixth diode D6, one end of the fourth capacitor C4 is connected to the other end of the first inductance L1, the other end of the fourth capacitor C4 is connected to a cathode end of the sixth diode D6, an anode end of the sixth diode D6 is connected to an output end of the power control chip U1, and the sixth resistor R6 is connected to the two ends of the fourth capacitor C4 in parallel.

As shown in FIG. 5, the control unit 22 includes a microcontroller U2, a clock circuit and a memory chip U3. The microcontroller U2 is connected to an output end V+ of the DC power supply, and the microcontroller U2 is MCU. Since the microcontroller U2 is a programmable controller, when a mode selector sends an operation signal to the microcontroller U2, the microcontroller U2 sends a control signal enabling the lamp 23a to work according to a programming rule.

As shown in FIG. 5, in this embodiment, the preferred mode is as follows: a voltage-stabilizing filter circuit is arranged between the output end V+ of the DC power supply 21 and the microcontroller U2, the voltage-stabilizing filter circuit includes a twelfth resistor R12, a voltage-stabilizing diode ZD1 and a sixth capacitor C6, one end of the twelfth resistor R12 is connected to the output end V+ of the DC power supply, the other end of the twelfth resistor R12 is connected to a cathode end of the voltage-stabilizing diode ZD1, an anode end of the voltage-stabilizing diode ZD1 is grounded, one end of the sixth capacitor C6 is connected to the cathode end of the voltage-stabilizing diode ZD1, the other end of the sixth capacitor C6 is grounded, and a pin 5 of the microcontroller U2 is connected to one end of the sixth capacitor C6.

As shown in FIG. 5, the clock circuit includes a crystal oscillator XL1, a twelfth capacitor C12 and a thirteenth capacitor C13, the two ends of the crystal oscillator XL1 are respectively connected to the pin 6 and the pin 7 of the microcontroller U2, one end of the twelfth capacitor C12 is connected to one end of the crystal oscillator XL1, the other end of the twelfth capacitor C12 is grounded, one end of the thirteenth capacitor C13 is connected to the other end of the crystal oscillator XL1, and the other end of the thirteenth capacitor C13 is grounded.

As shown in FIG. 5, the pin 8 of the memory chip U3 is connected to the output end V+ of the DC power supply, after setting the voltage-stabilizing filter circuit, preferably, the pin 8 of the memory chip U3 is connected to one end of the sixth capacitor C6. The pins 1, 2, 3, 4 and 7 of the memory chip U3 are grounded, the pin 5 of the memory chip U3 is connected to the pin 1 of the microcontroller U2, the pin 6 of the memory chip U3 is connected to the pin 2 of the microcontroller U2, the current working mode is output to the memory chip U3 through the microcontroller U2, so that the memory chip U3 can record the working mode. After power failure, the working mode of the microcontroller U2 before stopping work is still recorded in the memory chip U3; and after the microcontroller U2 is powered on again, the microcontroller U2 reads the recorded working mode from the memory chip U3, and sends a control signal to a loading lamp 23a in this working mode. Except that the memory chip U3 is configured outside the microcontroller U2, the memory chip U3 may also be set inside the microcontroller U2. Certainly, the memory chip U3 is not necessary, namely, whether to connect U3 may be decided according to needs.

As shown in FIG. 5, the switch unit 23 in this embodiment includes three sets of switch circuits, each set of switch circuit includes a load connecting part as well as a first switch tube and a second switch tube that are independently controlled by the control unit, the first switch tube and the second switch tube may be a triode or a MOS tube. The triode is taken as an example for illustration in this embodiment, wherein the first switch tube is replaced by the first triode for illustration, and the second switch tube is replaced by a second triode for illustration.

A collecting electrode of the first triode is connected to a collecting electrode of a second triode, a base electrode of the second triode is connected to the output end of the control unit 22, an emitting electrode of the second triode is grounded, and the load connecting part is arranged at the connecting part of the collecting electrode of the first triode and the collecting electrode of the second triode.

As shown in FIG. 5, in this embodiment, the first triode Q3 in the first set of switch circuit is a PNP triode or a P-channel MOS tube, the second triode Q4 in the first set of switch circuit is a NPN triode or a N-channel MOS tube, the base electrode of the first triode Q3 in the first set of switch circuit is connected to the pin 10 of the microcontroller U2, the base electrode of the first triode Q3 in the first set of switch circuit is preferentially connected to the pin 10 of the microcontroller U2 through the first current-limiting resistor RA1, the emitting electrode of the first triode Q3 in the first set of switch circuit is connected to the output end V+ of the DC power supply, the base electrode of the second triode Q4 in the first set of switch circuit is connected to the pin 16 of the microcontroller U2, the base electrode of the second triode Q4 in the first set of switch circuit is preferentially connected to the pin 16 of the microcontroller U2 through a second current-limiting resistor RB1, the emitting electrode of the second triode Q4 in the first set of switch circuit is grounded, and the load connecting part A in the first set of switch circuit is connected to the connecting part of the collecting electrode of the first triode Q3 in the first set of switch circuit and the collecting electrode of the second triode Q4 in the first set of switch circuit. The first output connecting terminal 8a is welded with the load connecting part A.

As shown in FIG. 5, the first triode Q2 in the second set of switch circuit is a PNP triode or a P-channel MOS tube, the second triode Q5 in the second set of switch circuit is a NPN triode or a N-channel MOS tube, the base electrode of the first triode Q2 in the second set of switch circuit is connected to the pin 11 of the microcontroller U2, the base electrode of the first triode Q2 in the second set of switch circuit is preferentially connected to the pin 11 of the microcontroller U2 through the third current-limiting resistor RA2, the emitting electrode of the first triode Q2 in the second set of switch circuit is connected to the output end V+ of the DC power supply, the base electrode of the second triode Q5 in the second set of switch circuit is connected to the pin 15 of the microcontroller U2, the base electrode of the second triode Q5 in the second set of switch circuit is preferentially connected to the pin 15 of the microcontroller U2 through a fourth current-limiting resistor RB2, the emitting electrode of the second triode Q5 in the second set of switch circuit is grounded, and the load connecting part B in the second set of switch circuit is connected to the connecting part of the collecting electrode of the first triode Q2 in the second set of switch circuit and the collecting electrode of the second triode Q5 in the second set of switch circuit. The second output connecting terminal 8b is welded with the load connecting part B.

As shown in FIG. 5, the first triode Q1 in the third set of switch circuit is a PNP triode or a P-channel MOS tube, the second triode Q6 in the third set of switch circuit is a NPN triode or a N-channel MOS tube, the base electrode of the first triode Q1 in the third set of switch circuit is connected to the pin 13 of the microcontroller U2, the base electrode of the first triode Q1 in the third set of switch circuit is preferentially connected to the pin 13 of the microcontroller U2 through the fifth current-limiting resistor RA3, the emitting electrode of the first triode Q1 in the third set of switch circuit is connected to the output end V+ of the DC power supply, the base electrode of the second triode Q6 in the third set of switch circuit is connected to the pin 14 of the microcontroller U2, the base electrode of the second triode Q6 in the third set of switch circuit is preferentially connected to the pin 14 of the microcontroller U2 through a sixth current-limiting resistor RB3, the emitting electrode of the second triode Q6 in the third set of switch circuit is grounded, and the load connecting part C in the third set of switch circuit is connected to the connecting part of the collecting electrode of the first triode Q1 in the third set of switch circuit and the collecting electrode of the second triode Q6 in the third set of switch circuit. The third output connecting terminal 8c is welded with the load connecting part C.

(1) When the pins 10 and 16 of the microcontroller U2 output high level, the first triode Q3 in the first set of switch circuit is turned off, the second triode Q4 in the first set of switch circuit is turned on, and the level of the connecting part of the collecting electrode of the first triode Q3 in the first set of switch circuit and the collecting electrode of the second triode Q4 in the first set of switch circuit is equal to the ground, namely, the low level, at this time, the level of the load connecting part A in the first set of switch circuit is the low level.

(2) When the pins 10 and 16 of the microcontroller U2 output low level, the first triode Q3 in the first set of switch circuit is turned on, the second triode Q4 in the first set of switch circuit is turned off, and the level of the connecting part of the collecting electrode of the first triode Q3 in the first set of switch circuit and the collecting electrode of the second triode Q4 in the first set of switch circuit is from the output end V+ of the DC power supply, namely, the high level, at this time, the level of the load connecting part A in the first set of switch circuit is the high level.

(3) When the pin 10 of the microcontroller U2 outputs high level and the pin 16 of the microcontroller U2 outputs low level, the first triode Q3 in the first set of switch circuit is turned off, the second triode Q4 in the first set of switch circuit is turned off, and the connecting part of the collecting electrode of the first triode Q3 in the first set of switch circuit and the collecting electrode of the second triode Q4 in the first set of switch circuit has no output.

(4) When the pin 10 of the microcontroller U2 outputs low level and the pin 16 of the microcontroller U2 outputs high level, the first triode Q3 in the first set of switch circuit is turned on, the second triode Q4 in the first set of switch circuit is turned on, and the current from the output end V+ of the DC power supply flows to the ground directly, thereby causing the short circuit of the first set of switch circuit, and this situation is not allowed.

As shown in FIG. 5, since the load connecting parts of three sets of switch circuits may output high level or low level, and control the duty cycle output by each switch circuit, the load lamp 23a may show different flashing modes according to a circuit structure of the load lamp 23a.

As shown in FIG. 3a and FIG. 5, the lamp 23a in this embodiment includes a first wire 24, a second wire 25, a third wire 26, a first LED lamp 27, a second LED lamp 28, a third LED lamp 29 and a fourth LED lamp 30, the first wire 24 is connected to the load connecting part A of the first set of switch circuit, the second wire 25 is connected to the load connecting part B of the second set of switch circuit, and the third wire 3 is connected to the load connecting part C of the third set of switch circuit.

As shown in FIG. 3a and FIG. 5, an anode end of the first LED lamp 27 is connected to the first wire 24, and a cathode end of the first LED lamp 27 is connected to the second wire 25; a cathode end of the second LED lamp 28 is connected to the first wire 24, and an anode end of the second LED lamp 28 is connected to the second wire 25; a cathode end of the third LED lamp 29 is connected to the second wire 25, and an anode end of the third LED lamp 29 is connected to the third wire 26; and an anode end of the fourth LED lamp 30 is connected to the second wire 25, and a cathode end of the fourth LED lamp 30 is connected to the third wire 26.

As shown in FIG. 3a and FIG. 5, based on the circuit structure of the above lamp 23a, the working is divided into the following states:

(1) As shown in 3a and FIG. 5, the load connecting part A of the first set of switch circuit outputs high level, the load connecting part B of the second set of switch circuit and the load connecting part C of the third set of switch circuit output low level, so that the first LED lamp 27 works, and the remaining LED lamps are extinguished.

(2) As shown in 3a and FIG. 5, the load connecting part A of the first set of switch circuit outputs low level, the load connecting part B of the second set of switch circuit and the load connecting part C of the third set of switch circuit output high level, so that the second LED lamp 28 works, and the remaining LED lamps are extinguished.

(3) As shown in 3a and FIG. 5, the load connecting part A of the first set of switch circuit and the load connecting part B of the second set of switch circuit output low level, the load connecting part C of the third set of switch circuit outputs high level, so that the third LED lamp 29 works, and the remaining LED lamps are extinguished.

(4) As shown in 3a and FIG. 5, the load connecting part A of the first set of switch circuit and the load connecting part B of the second set of switch circuit output high level, the load connecting part C of the third set of switch circuit outputs low level, so that the fourth LED lamp 30 works, and the remaining LED lamps are extinguished.

As shown in 3a and FIG. 5, the above three wires and four circuits of lamps form a three-wire and four-circuit lamp 23a. However, the lamp 23a in this embodiment is not limited to this. For example, as shown in FIG. 5, the lamp further includes a fifth LED lamp 31 and a sixth LED lamp 32, wherein an anode end of the fifth LED lamp 31 is connected to the first wire 24, and a cathode end of the fifth LED lamp 31 is connected to the third wire 26; and a cathode end of the sixth LED lamp 32 is connected to the first wire 24, and an anode end of the sixth LED lamp 32 is connected to the third wire 26. The fifth LED lamp 31 and the sixth LED lamp 32 are added based on the three-wire and four-circuit, so as to form a three-wire and six-circuit lamp.

As shown in 3a and FIG. 5, any one of the above ways can control the duty cycle and the work time of each LED lamp, and different work time may show different lighting effects. Moreover, this implementation mode is respectively connected to the controller through three wires, at least four circuits of LED lamps are also connected among the three wires, apparently, the showed lighting effect is better than that in the prior art. The controller structure and the circuit structure are simpler in a case that the circuit quantity connecting to the lamp is more than that in the prior art, so that the cost will not be increased. In addition, the two triodes in each set of switch circuit will be controlled by the microcontroller U2, so as to decide whether the level output by the switch circuit is the high level or the low level. Each triode is independently controlled, so a case that the conduction of one triode is decided by another triode in the prior art is avoided, and the control efficiency of the controller is improved.

As shown in FIG. 5, the position of the lamp controller is hard to find in an environment with low illumination. Therefore, in this embodiment, the preferred way is to further include an indicator LED 2, which is always on after being powered on, so as to indicate the position of the lamp controller. The indicator LED 2 is electrically connected to an output end of the DC power supply 21, namely, the output end V+ of the DC power supply is connected to the indicator LED 2. The indicator LED2 will keep lighting as long as the output end V+ of the DC power supply outputs the working voltage, so as to indicate the specific position of the lamp controller. In this embodiment, a nineteenth current-limiting resistor R19 is connected between the indicator LED2 and the twelfth resistor R12, and the current of the indicator LED2 is reached by reducing the nineteenth current-limiting resistor R19, thereby avoiding the damage on the indicator LED2.

As shown in FIG. 5, since a plurality of lamp flashing modes are built in the microcontroller U2, a switching signal for switching the flashing modes is sent to the microcontroller U2, and the microcontroller U2 outputs different control signals, such as the high level or the low level for controlling each set of switch circuit to be output, or the duty cycle for controlling each set of switch circuit to output the signal, so as to form different flashing modes. Certainly, the work time of the lamp 23a may be controlled through a selected mode, for example, working in an appointed working period, or stopping working in an appointed working period.

As shown in FIG. 5, based on the above description, this embodiment further includes a mode selector which inputs a light flashing mode switching signal or a light timing signal to the control unit 22, and the mode selector is electrically connected to the control unit. The mode selector may be controlled in a wired mode or a wireless mode. When adopting the mode selector with the wired mode, the mode selector is directly welded with the control unit 22; when adopting the mode selector with the wireless mode, a part of this mode selector is directly welded with the control unit 22, and the other part of this mode selector communicates with the control unit 22 in a form of wireless signal transmission.

As shown in FIG. 5, in this embodiment, the mode selector adopts a key switch SW or a touch switch (not shown in the figure). The key switch SW or the touch switch is electrically connected to the control unit 22, in this embodiment, one end of the key switch SW is preferentially welded with the pin 8 of the microcontroller U2, and the other end of the key switch SW is grounded.

As shown in FIG. 5, in this embodiment, a wireless signal receiver U4 is also adopted at the same time. One end of the wireless signal receiver U4 is welded with the pin 5 of the microcontroller U2, and the other end of the wireless signal receiver U4 is connected to the pin 9 of the microcontroller U2. A wireless signal transmitter paired with the wireless signal receiver U4 is not shown in the figure, the wireless signal transmitter is usually a hand-held remote control, the wireless signal transmitter communicates with the wireless signal receiver U4 through an infrared signal, and after receiving the signal sent by the wireless signal transmitter, the wireless signal receiver U4 is configured to change the flashing mode or the timing signal of the lamp 23a.

As shown in FIG. 5, in order to know whether the lamp 23a is in a timing state, this embodiment further includes a timing indicator LED1 for indicating the timing state after the control unit 22 starts the light timing according to the input of the mode selector, and the timing indicator LED1 is electrically connected to the control 22. The timing indicator LED1 is a light-emitting diode, one end of the timing indicator LED1 is connected to the pin 4 of the microcontroller U2, and the other end of the timing indicator LED1 is grounded through an eighteenth resistor. When the timing is started, the control unit 22 outputs a signal capable of lighting the timing indicator LED1, and when the timing is end, the control unit 22 outputs a signal capable of extinguishing the timing indicator LED1.

In addition to connect to the three-wire and four-circuit lamp 23a in FIG. 3a, the switch unit 23 in the embodiment 1 may also be connected to the three-wire and six-circuit lamp 23a in FIG. 3b.

Embodiment 2

Figure 6:
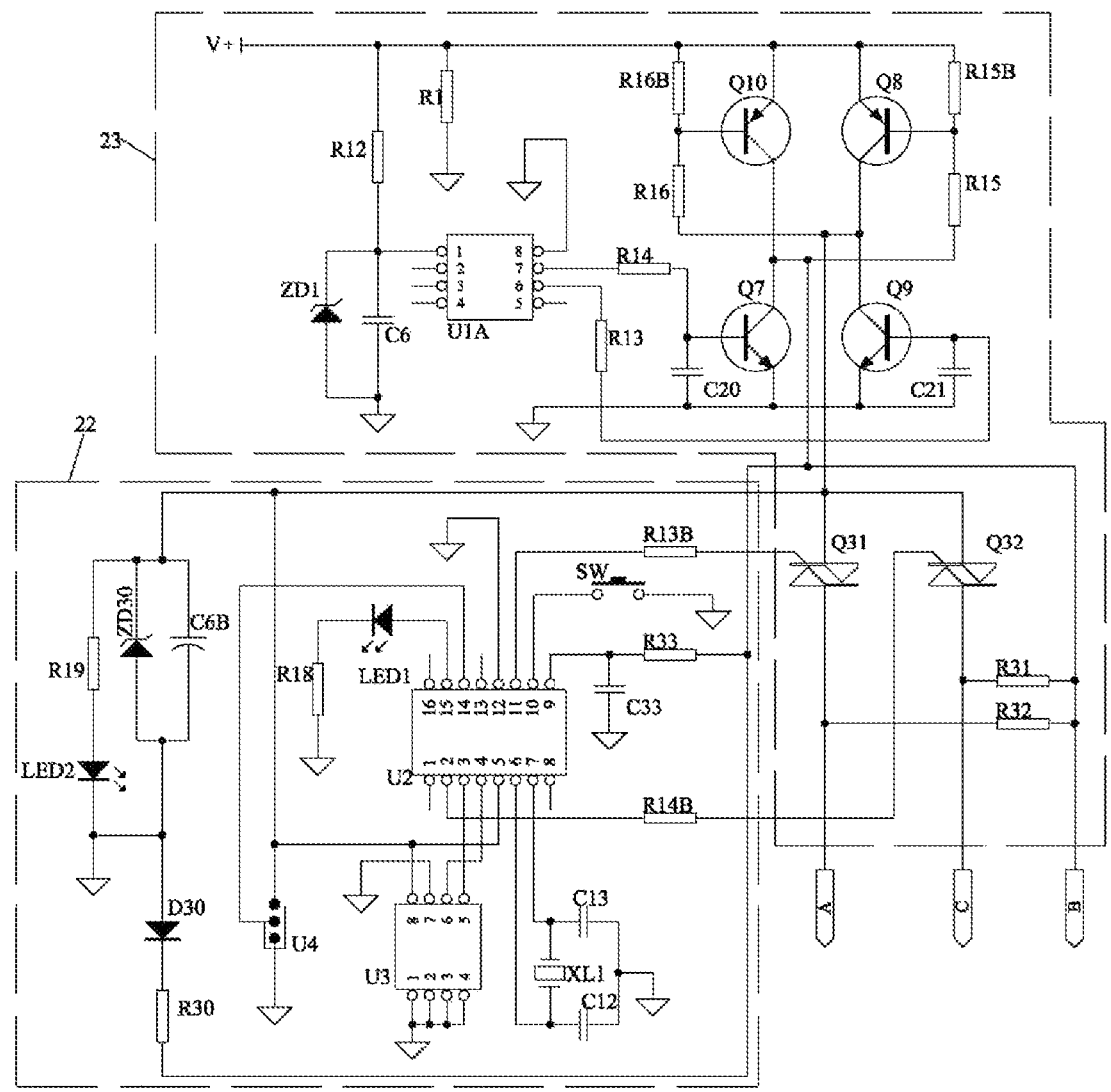
FIG. 6 is a schematic diagram of a second control unit and a switch unit in the disclosure.

As shown in FIG. 6, in this lamp controller, the structure of the DC power supply 21 is the same as the DC power supply in the embodiment 1, therefore the structures of the second control unit 22 and the switch unit 23 in the disclosure are not repeated herein.

The output end V+ of the DC power supply 21 is electrically connected to the switch unit 23, and the switch unit 23 includes a first switch set, a second switch set and a control module U1A for controlling the first switch set and the second switch set to be turned on alternately.

An output end of the control module U1A is electrically connected to the first switch set, and the output end of the control module U1A forms a second set of switch circuit after being electrically connected to the second switch set.

The difference between this embodiment and the embodiment 1 is that the voltage-stabilizing filter circuit is arranged between the output end V+ of the DC power supply and the control module U1A, namely, one end of the twelfth resistor R12 in the voltage-stabilizing filter circuit is connected to the output end V+ of the DC power supply, the other end of the twelfth resistor R12 is connected to the cathode end of the voltage-stabilizing diode ZD1, the anode end of the voltage-stabilizing diode ZD1 is grounded, one end of the sixth capacitor C6 is connected to the cathode end of the voltage-stabilizing diode ZD1, the other end of the sixth capacitor C6 is grounded, and the pin 1 of the microcontroller U2 is connected to one end of the sixth capacitor C6.

In this embodiment, the second switch set includes a ninth triode Q9 and a tenth triode Q10, a base electrode of the ninth triode Q9 is connected to the output end of the control module U1A, the control module U1A is a chip, the base electrode of the ninth triode Q9 is connected to the pin 6 of the control module U1A through a thirteenth resistor R13, the base electrode of the ninth triode Q9 is also connected to one end of a twenty-first capacitor C21, the other end of the twenty-first capacitor C21 is grounded, an emitting electrode of the ninth triode Q9 is grounded, a collecting electrode of the ninth triode Q9 is respectively connected to a base electrode of the tenth triode Q10 and the output end of the DC power supply 21, a sixteenth resistor R16 is connected between the ninth triode Q9 and the output end V+ of the DC power supply 21, a sixteenth current-limiting resistor R16B is connected between the base electrode of the tenth triode Q10 and the output end V+ of the DC power supply 21, an emitting electrode of the tenth triode Q10 is connected to the output end V+ of the DC power supply 21, and the collecting electrode of the tenth triode Q10 is the output end of the second set of switch circuit. Based on the above structure, a deformed or replaced solution is that the ninth triode Q9 and the tenth triode Q10 may be replaced by the MOS tube.

The working process of the second set of switch circuit is as follows: when the pin 6 of the control module U1A outputs high level, the high level is provided to the ninth triode Q9 after being subjected to current-limiting through the thirteenth resistor R13, so as to trigger the ninth triode Q9. Since the collecting electrode of the ninth triode Q9 is connected to the output end V+ of the DC power supply 21 through the sixteenth resistor R16, the ninth triode Q9 is turned on after the base electrode of the ninth triode Q9 is triggered. The emitting electrode of the ninth triode Q9 is grounded, so the collecting electrode of the ninth triode Q9 is lowered to the low level after the ninth triode Q9 is turned on, however the base electrode of the tenth triode Q10 is connected to the collecting electrode of the ninth triode Q9 and the emitting electrode of the tenth triode Q10 is connected to the output end V+ of the DC power supply 21, so when the base electrode of the tenth triode Q10 is the low level, the tenth triode Q10 is turned on, and then the collecting electrode of the tenth triode Q10 outputs high level, namely, the output end of the second set of switch circuit outputs high level.

When the pin 6 of the control module U1A outputs low level, the ninth triode Q9 and the tenth triode Q10 are in a cut-off state, namely, the output end of the second set of switch circuit outputs low level.

The first switch set includes a seventh triode Q7 and an eighth triode Q8, a base electrode of the seventh triode Q7 is connected to the output end of the control module U1A, the base electrode of the seventh triode Q7 is connected to the pin 7 of the control module U1A through a fourteenth resistor R14, the base electrode of the seventh triode Q7 is also connected to one end of the twenty-first capacitor C21, the other end of the twenty-first capacitor C21 is grounded, an emitting electrode of the seventh triode Q7 is grounded, a collecting electrode of the seventh triode Q7 is respectively connected to a base electrode of the eighth triode Q8 and the output end of the DC power supply 21, a fifteenth resistor R15 is connected between the seventh triode Q7 and the output end V+ of the DC power supply 21, a fifteenth current-limiting resistor R16B is connected between the base electrode of the eighth triode Q8 and the output end V+ of the DC power supply 21, an emitting electrode of the eighth triode Q8 is connected to the output end V+ of the DC power supply 21, and a collecting electrode of the eighth triode Q8 is electrically connected to a first toggle switch Q31 and a second toggle switch Q32 in respective. Based on the above structure, a deformed or replaced solution is that the seventh triode Q7 and the eighth triode Q8 may be replaced by the MOS tube.

The working process of the second set of switch circuit is as follows: when the pin 7 of the control module U1A outputs high level, the high level is provided to the seventh triode Q7 after being subjected to current-limiting through the fourteenth resistor R14, so as to trigger the seventh triode Q7. Since the collecting electrode of the seventh triode Q7 is connected to the output end V+ of the DC power supply 21 through the fifteenth resistor R15, the seventh triode Q7 is turned on after the base electrode of the seventh triode Q7 is triggered. The emitting electrode of the seventh triode Q7 is grounded, so the collecting electrode of the seventh triode Q7 is lowered to the low level after the seventh triode Q7 is turned on, however the base electrode of the eighth triode Q8 is connected to the collecting electrode of the seventh triode Q7 and the emitting electrode of the eighth triode Q8 is connected to the output end V+ of the DC power supply 21, so when the base electrode of the eighth triode Q8 is the low level, the eighth triode Q8 is turned on, and then the collecting electrode of the eighth triode Q8 outputs high level, namely, the output end of the first set of switch circuit outputs high level.

When the pin 7 of the control module U1A outputs low level, the seventh triode Q7 and the eighth triode Q8 are in a cut-off state, namely, the output end of the first set of switch circuit outputs low level.

The pins 6 and 7 of the control module U1A output high level and low level alternately, so the first set of switch circuit and the second set of switch circuit output high level and low level alternately.

The lamp controller further includes a control unit 22, and in this embodiment, the structure of the control unit 22 is the same as that of the embodiment 1, so the control unit 22 is not repeated herein.

The control unit 22 is electrically connected to the switch unit 23, the switch unit 23 further includes a first toggle switch Q31 and a second toggle switch Q32, the first toggle switch Q31 forms the first set of switch circuit after being electrically connected to the output end of the first switch set and the control unit 22 in respective, and the second toggle switch Q32 forms the third set of switch circuit after being electrically connected to the output end of the first switch set and the control unit 22 in respective. In this embodiment, the first toggle switch Q31 and the second toggle switch Q32 are thyristors, wherein the pin 11 of the microcontroller U2 of the control unit 22 is connected to a gate electrode of the first toggle switch Q31 through the thirteenth current-limiting resistor R13B, and the pin 2 of the microcontroller U2 is connected to a gate electrode of the second toggle switch Q32 through the fourteenth current-limiting resistor R14B.

The control unit 22 is configured to provide a trigger signal to the first toggle switch Q31 and the second toggle switch Q32, when the output end of the first switch set outputs high level, the first toggle switch Q31 or the second toggle switch Q32 is controlled to be turned on through the control unit 22, and when the output end of the first switch set outputs low level, the first toggle switch Q31 or the second toggle switch Q32 is turned off.

For the above structure, the output end of the first toggle switch Q31 is the load connecting part A, the output end of the second set of switch circuit is the load connecting part B, the output end of the second toggle switch Q32 is the load connecting part C, the load connecting parts A, B and C are respectively connected to the lamps 23a shown in FIG. 3a or FIG. 3b, so as to control the lighting of each circuit of lamp luster. The specific conduction principle for controlling each circuit of lamp luster is the same as the embodiment 1, so it will not be repeated herein.

The switch unit 23 in the embodiment 2 can output higher voltage, for example, a circuit of namely, the output ends of the first set of switch and the second set of switch can output therefore a thirty-first current-limiting resistor R31 is connected between the output end of the second toggle switch Q32 and the output end of the second set of switch circuit, a thirty-second current-limiting resistor R32 is connected between the output end of the first toggle switch Q31 and the output end of the second set of switch circuit, the current is reduced through the current-limiting resistor, thereby avoiding damage on the lamp 23a connected later.

This embodiment further includes a power supply circuit which supplies power to the control unit 22, the output end of the first switch set is also connected to the power supply circuit, and the power supply circuit is electrically connected to the control unit 22. Namely, this embodiment does not adopt the way preferentially that the DC power supply 21 supplies power to the control unit 22, and supplies power to the control unit 22 in an indirect way. In this embodiment, when the output end of the first switch set, namely, the collecting electrode of the eighth triode Q8 outputs high level, the power supply circuit is charged, and the power supply circuit discharges so as to supply power to the control unit 22.

The power supply circuit includes an energy storage element C6B, a rectifier D30 and a thirtieth resistor R30, one end of the energy storage element G6B is electrically connected to the output end of the first switch set, namely, one end of the energy storage element C6B is respectively connected to the collecting electrode of the eighth triode Q8 and the pin 5 of the microcontroller U2, the other end of the energy storage element C6B is electrically connected to an anode end of the rectifier D30, a cathode end of the rectifier D30 is connected to one end of the thirtieth resistor R30, the other end of the thirtieth resistor R30 is electrically connected to the first switch set, namely, the other end of the thirtieth resistor R30 is connected to the collecting electrode of the seventh triode Q7.

As for the power supply circuit, the current flowing path is as follows: the current is output from the eighth triode Q8, and then finally grounded through the energy storage element C6B, the rectifier D30, the thirtieth resistor R30, the collecting electrode of the seventh triode Q7 and the emitting electrode of the seventh triode Q7 in turn. During this process, the current is reduced through the current-limiting function of the thirtieth resistor R30.

The power supply circuit further includes a voltage-stabilizing element ZD30, which is connected to the energy storage element C6B in parallel. The voltage-stabilizing element ZD30 enables the voltage of the power supply circuit to be a stable value.

This embodiment further includes an indicator LED2 which is always on after being powered on, so as to indicate the position of the lamp controller, one end of the indicator LED2 is connected to the energy storage element C6B, and the other end of the indicator LED2 is grounded. Preferably, the indicator LED2 is connected to the energy storage element C6B through the nineteenth resistor R19. Users are convenient to find the position of the lamp controller in time through the indicator LED2.

This embodiment further includes a mode selector which inputs a light flashing mode switching signal or a light timing signal to the control unit 22, and the mode selector is electrically connected to the control unit. The mode selector is the same as that in the embodiment 1, so it will not be repeated herein.

This embodiment further includes a sampling circuit, which enables the control unit 22 to know whether the second set of switch circuit outputs high level or low level, one end of the sampling circuit is connected to the output end of the second set of switch circuit, and the other end of the sampling circuit is electrically connected to the control unit 22. The sampling circuit includes a thirty-third resistor R33 and a thirty-third capacitor C33, one end of the thirty-third resistor R33 is connected to the output end of the second set of switch circuit, namely, connected to the load connecting part B, the other end of the thirty-third resistor R33 is respectively connected to the pin 9 of the microcontroller U2 and one end of the thirty-third capacitor C33, and the other end of the thirty-third capacitor C33 is grounded. The thirty-third resistor R33 is used for limiting current, so as to reduce the current, and the thirty-third capacitor C33 is used for filtering.

After acquiring the voltage output by the sampling circuit, the microcontroller U2 judges whether the output end of the second set of switch circuit outputs high level or low level in real time, so as to precisely output the trigger signal to the first toggle switch Q31 or the second toggle switch Q32.

Figure 7:
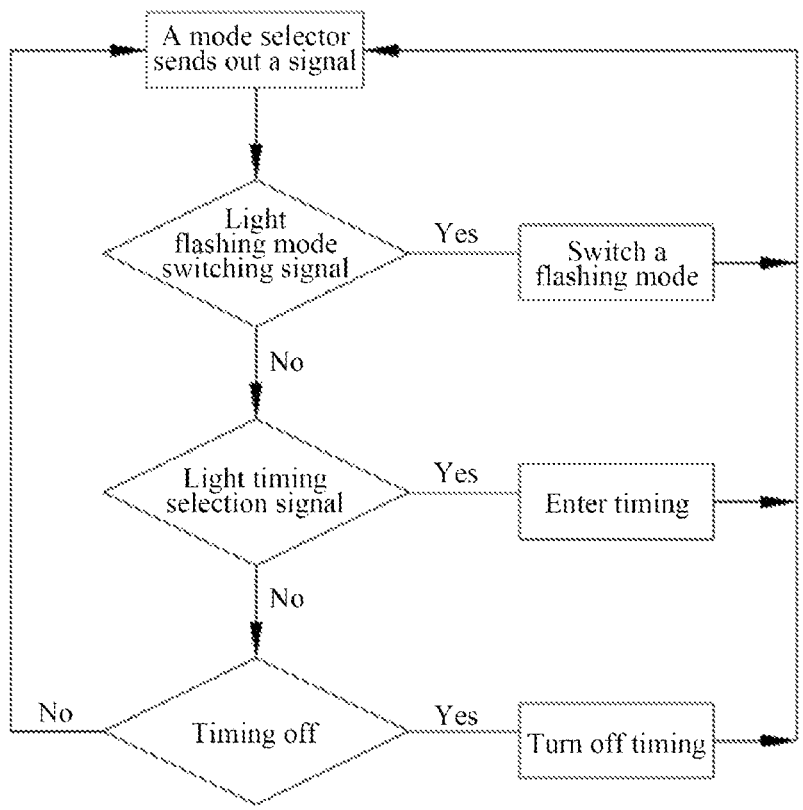
FIG. 7 is a flow diagram of a control method for a lamp.
Figure 8:
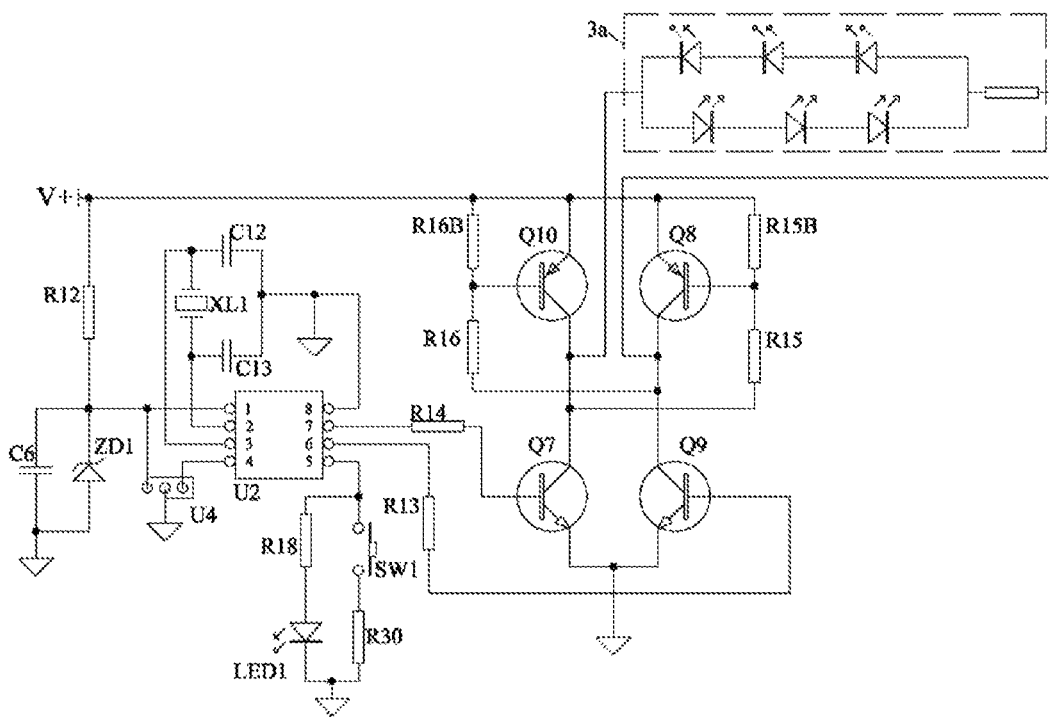
FIG. 8 is a schematic diagram of a third control unit and a switch unit.
Figure 9:
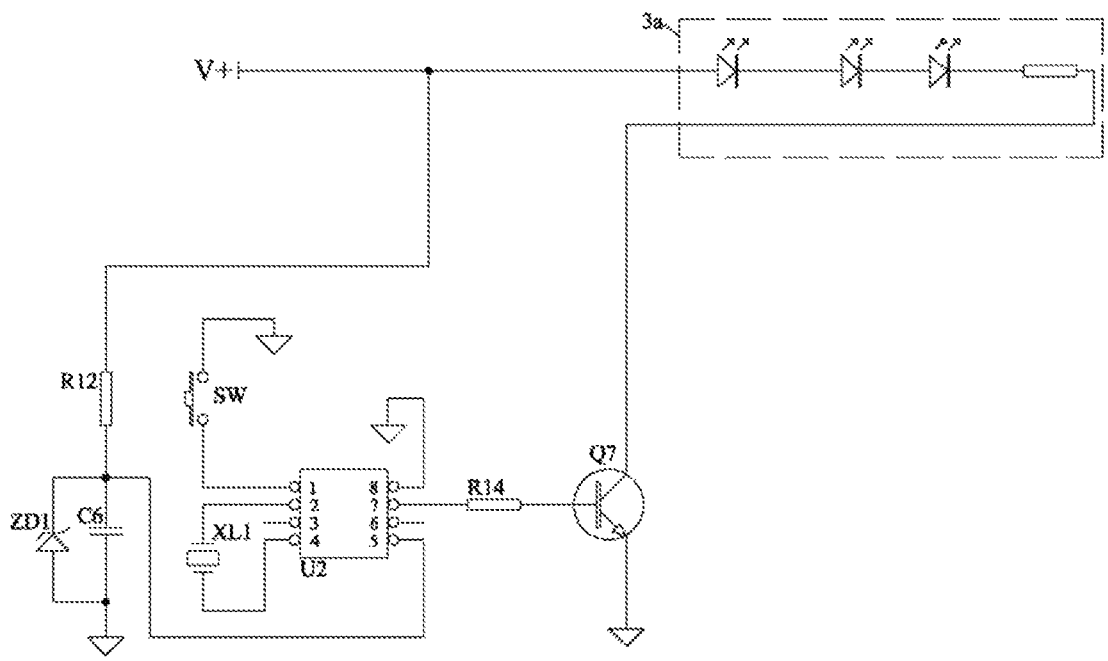
FIG. 9 is a schematic diagram of a fourth control unit and a switch unit.
Figure 10:
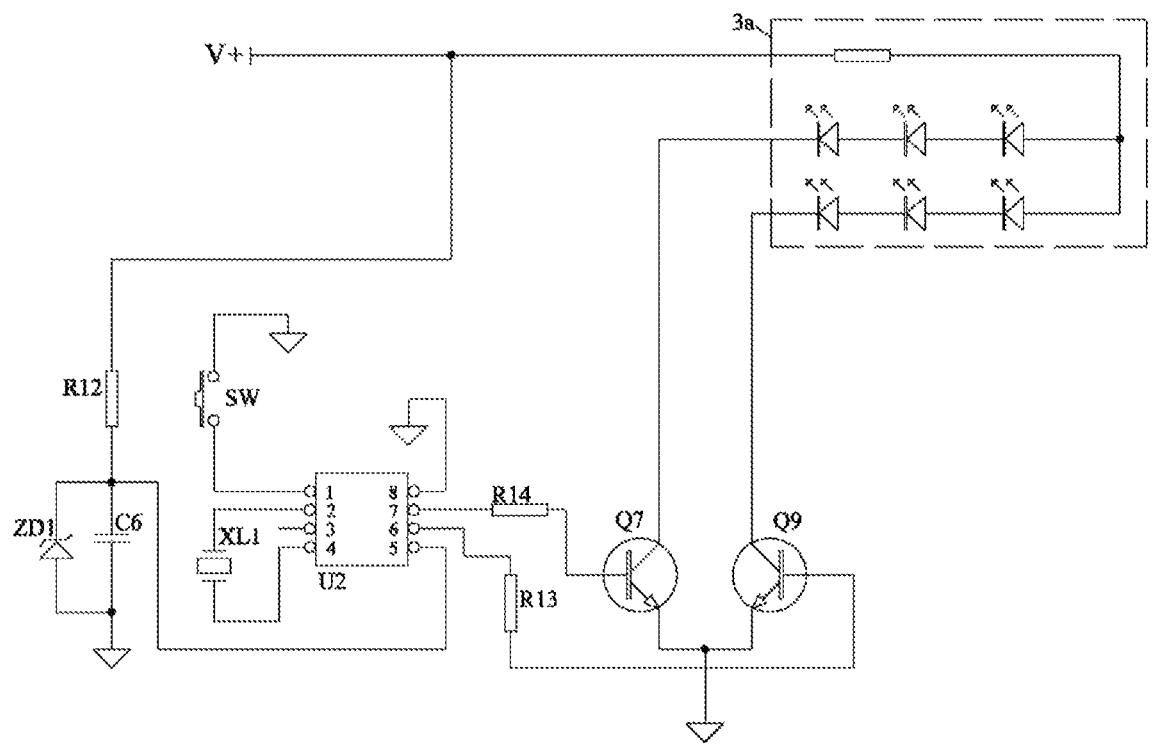
FIG. 10 is a schematic diagram of a fifth control unit and a switch unit.
Figure 11A:
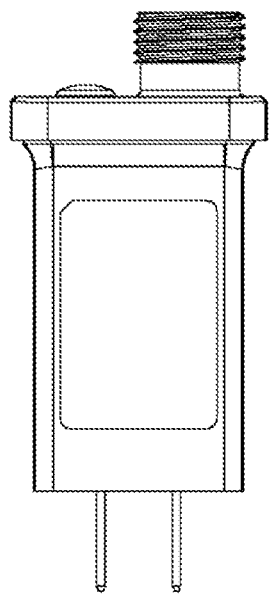
FIG. 11a to FIG. 11g are respectively orthographic views and solid diagrams of six surfaces of an appearance of a first lamp controller.
Figure 11B:
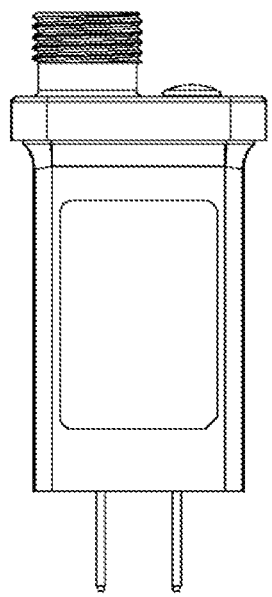
Figure 11C:
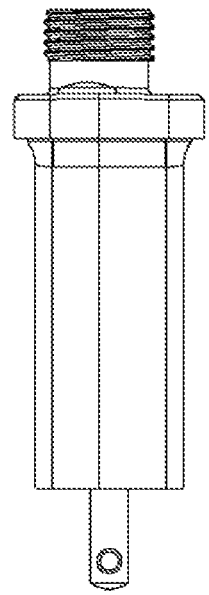
Figure 11D:
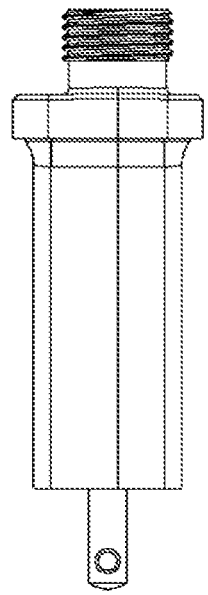
Figure 11E:
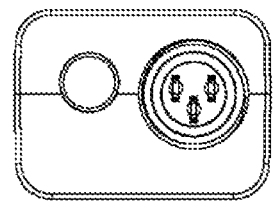
Figure 11F:
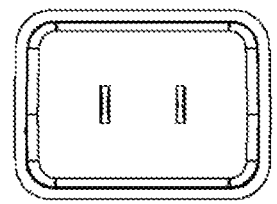
Figure 11G:
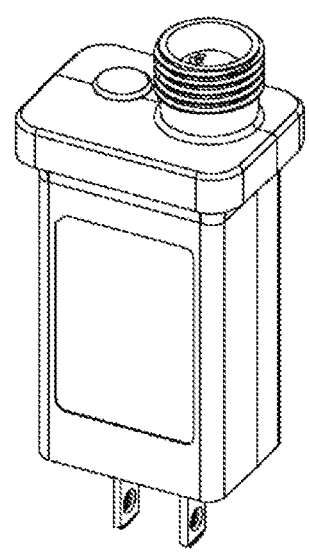
Figure 12A:
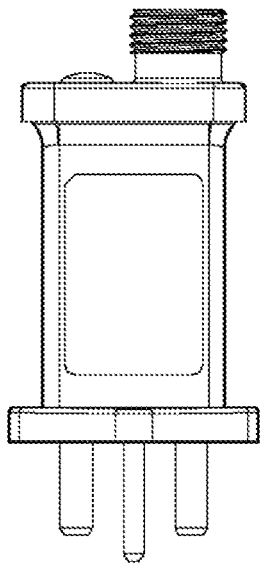
FIG. 12a to FIG. 12g are respectively orthographic views and solid diagrams of six surfaces of an appearance of a second lamp controller.
Figure 12B:
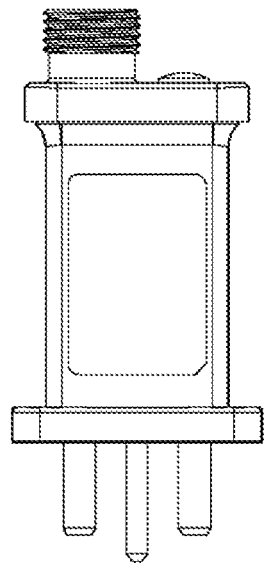
Figure 12E:
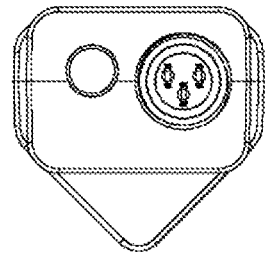
Figure 12F:
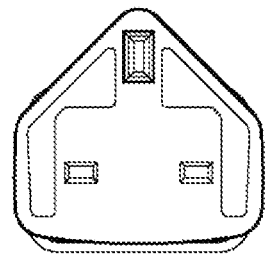
Figure 12C:
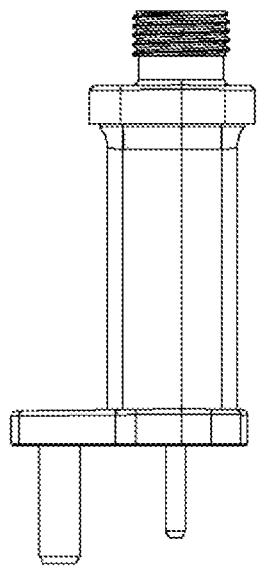
Figure 12D:
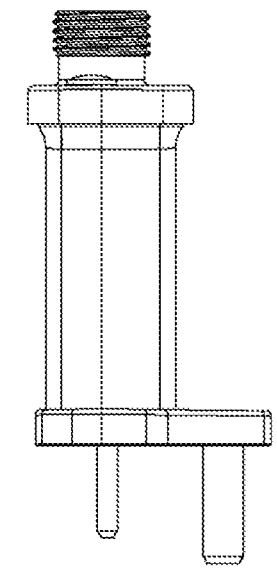
Figure 12G:
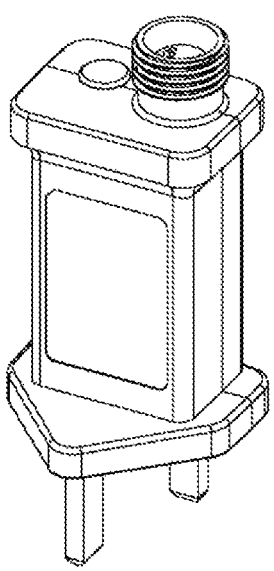
Figure 13A:
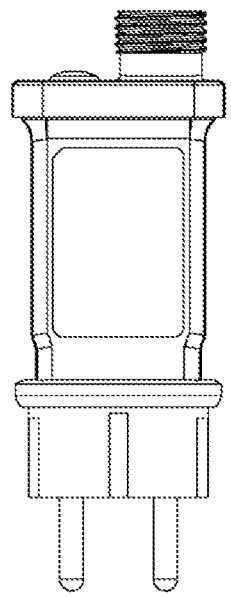
FIG. 13a to FIG. 13g are respectively orthographic views and solid diagrams of six surfaces of an appearance of a third lamp controller.
Figure 13B:
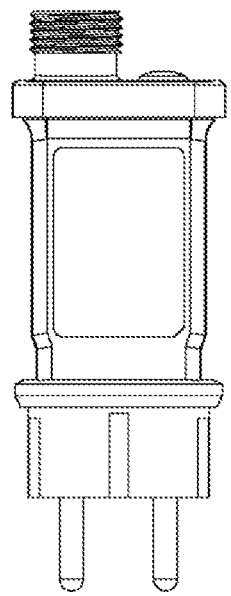
Figure 13E:
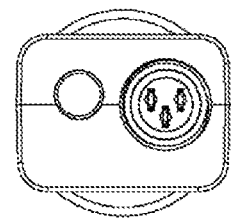
Figure 13F:
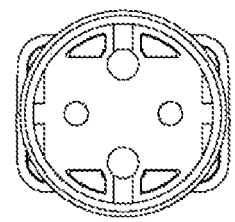
Figure 13C:
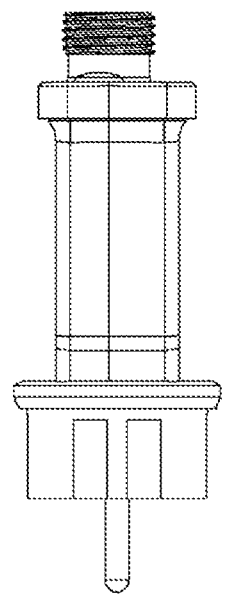
Figure 13D:
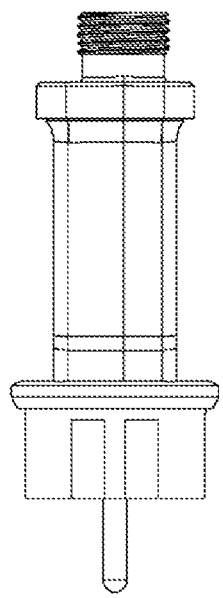
Figure 13G:
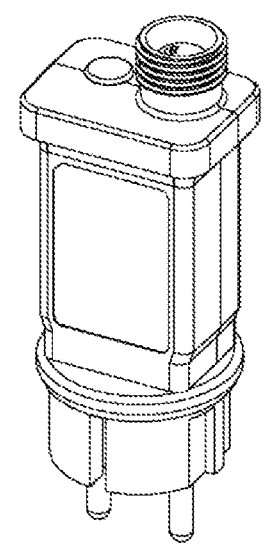
Figure 14A:
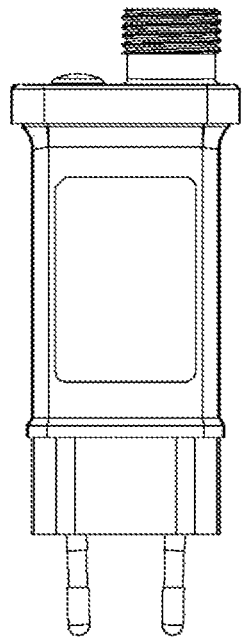
FIG. 14a to FIG. 14g are respectively orthographic views and solid diagrams of six surfaces of an appearance of a fourth lamp controller.
Figure 14B:
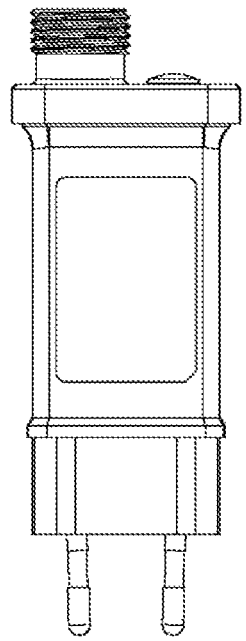
Figure 14E:
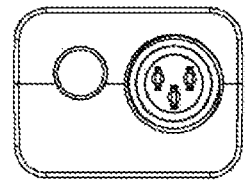
Figure 14F:
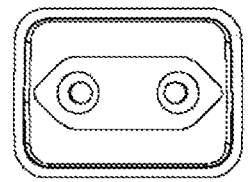
Figure 14C:
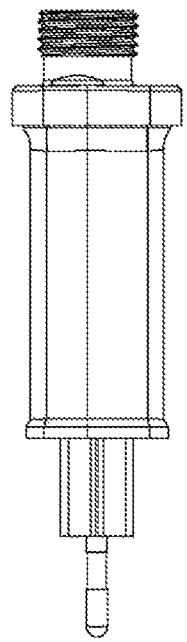
Figure 14D:
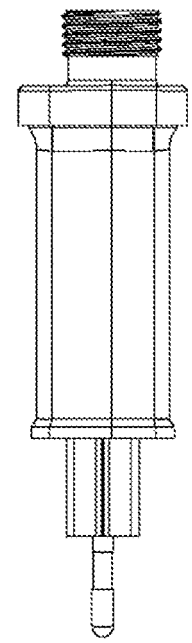
Figure 14G:
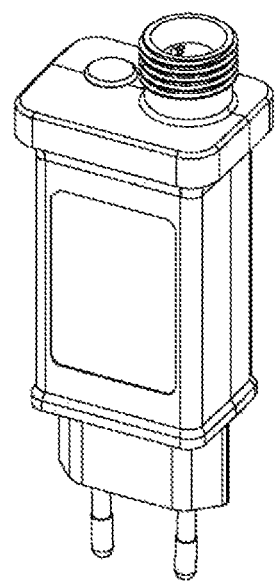
Figure 15A:
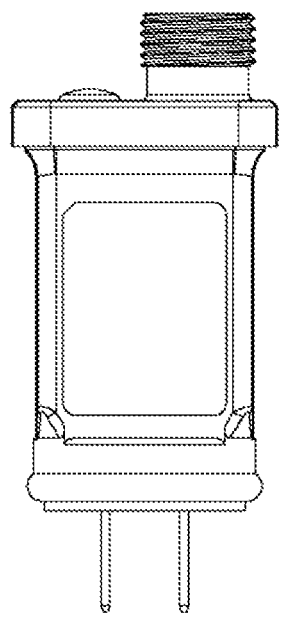
FIG. 15a to FIG. 15g are respectively orthographic views and solid diagrams of six surfaces of an appearance of a fifth lamp controller.
Figure 15B:
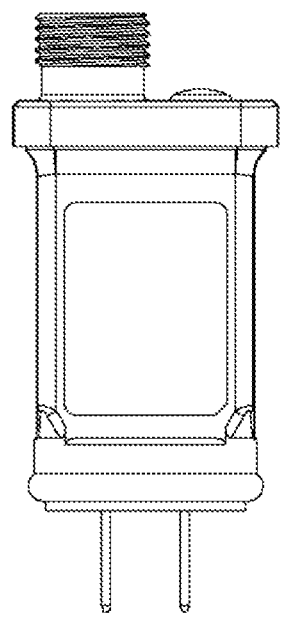
Figure 15E:
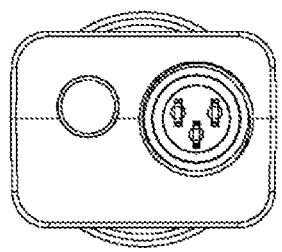
Figure 15F:
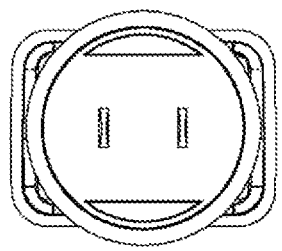
Figure 15C:
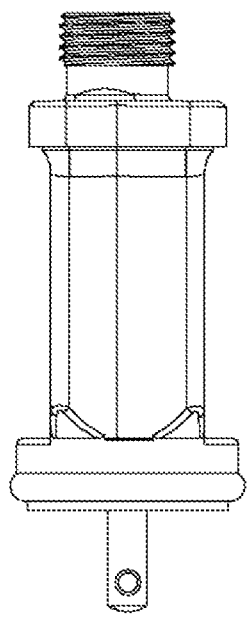
Figure 15D:
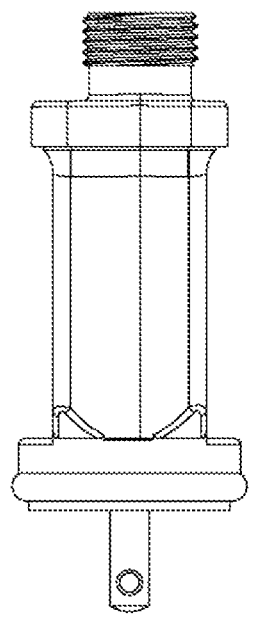
Figure 15G:
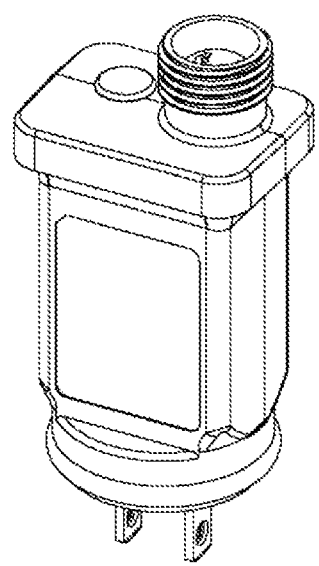
Figure 16A:
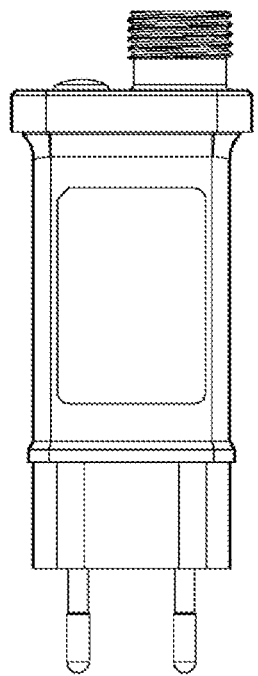
FIG. 16a to FIG. 16g are respectively orthographic views and solid diagrams of six surfaces of an appearance of a sixth lamp controller.
Figure 16B:
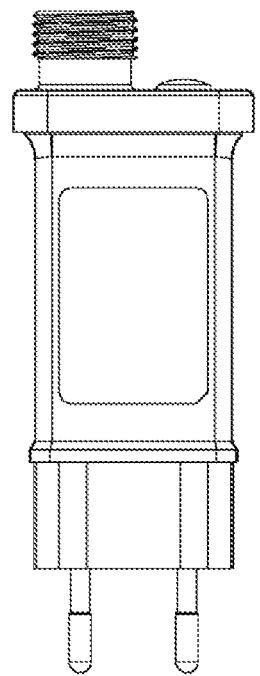
Figure 16E:
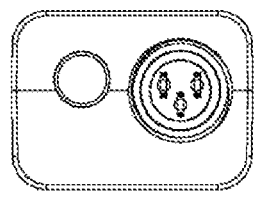
Figure 16F:
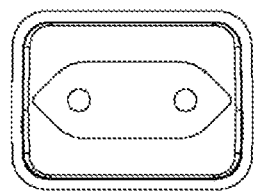
Figure 16C:
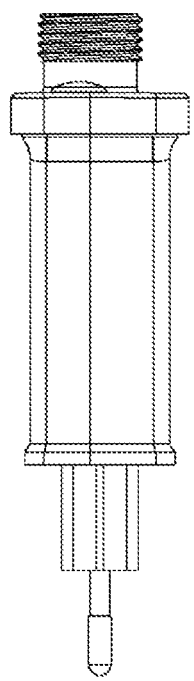
Figure 16D:
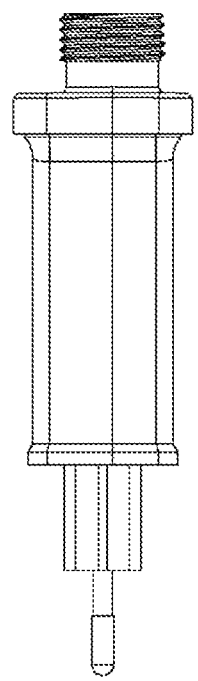
Figure 16G:
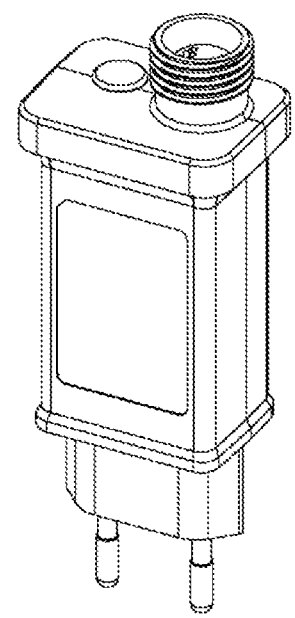
Figure 17A:
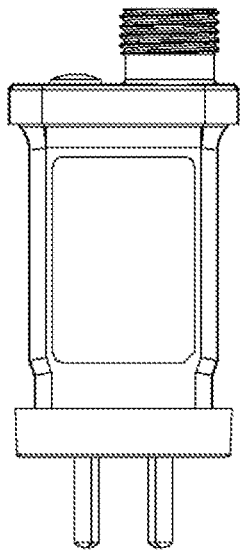
FIG. 17a to FIG. 17g are respectively orthographic views and solid diagrams of six surfaces of an appearance of a seventh lamp controller.
Figure 17B:
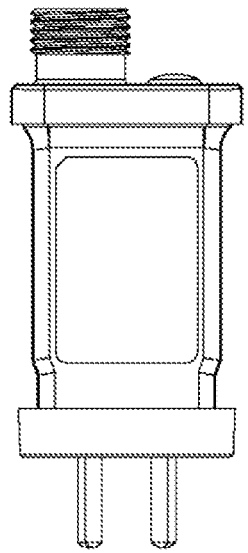
Figure 17E:
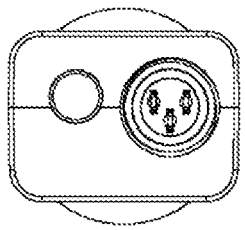
Figure 17F:
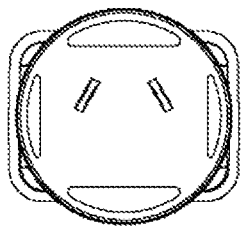
Figure 17C:
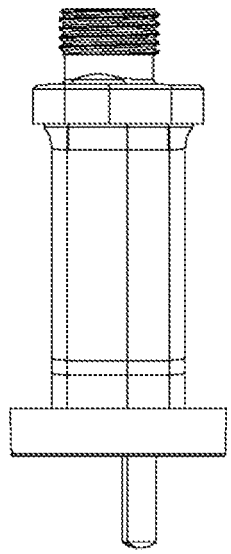
Figure 17D:
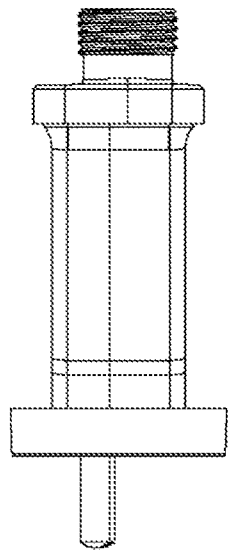
Figure 17G:
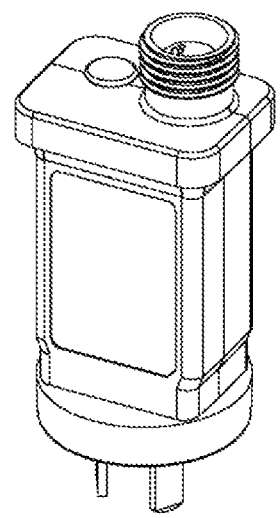
Figure 18A:
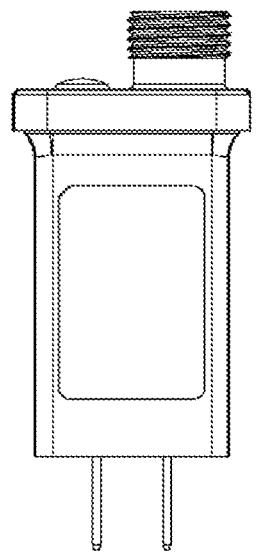
FIG. 18a to FIG. 18g are respectively orthographic views and solid diagrams of six surfaces of an appearance of an eighth lamp controller.
Figure 18B:
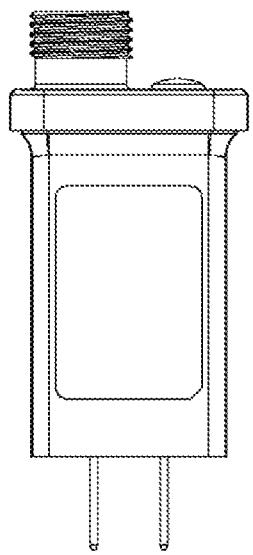
Figure 18E:
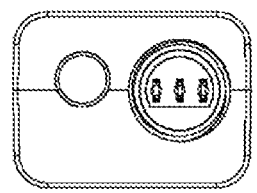
Figure 18F:
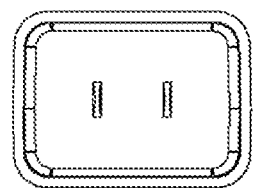
Figure 18C:
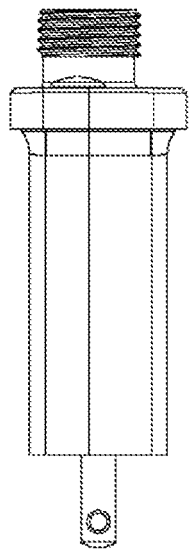
Figure 18D:
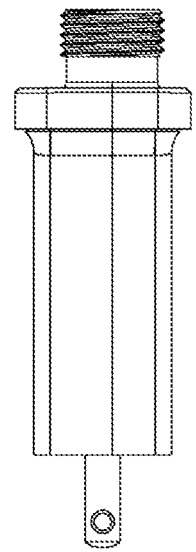
Figure 18G:
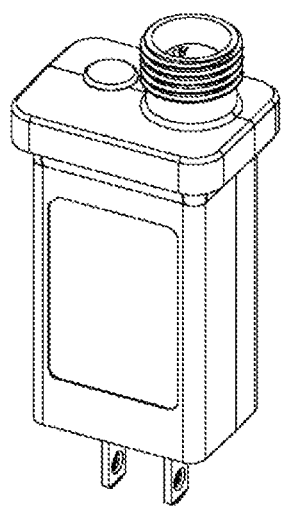
Figure 19A:
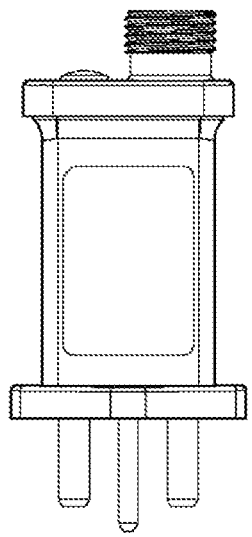
FIG. 19a to FIG. 19g are respectively orthographic views and solid diagrams of six surfaces of an appearance of a ninth lamp controller.
Figure 19B:
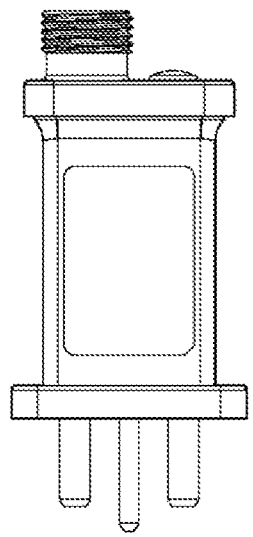
Figure 19E:
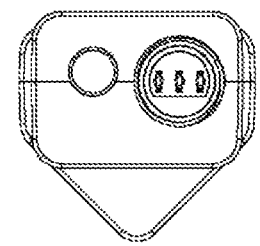
Figure 19F:
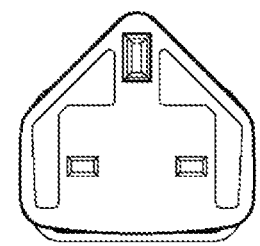
Figure 19C:
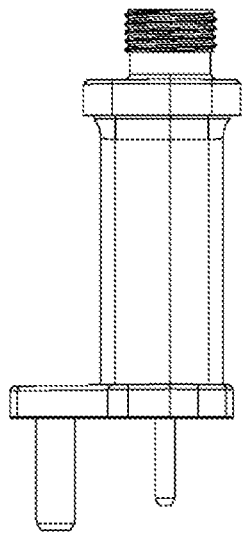
Figure 19D:
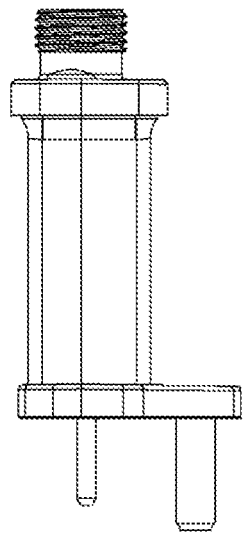
Figure 19G:
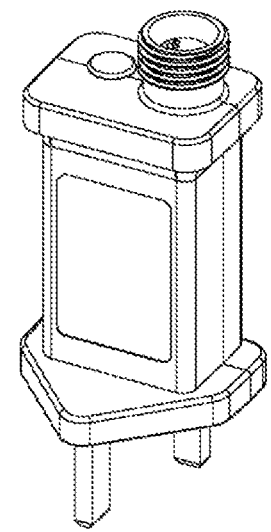
Figure 20A:
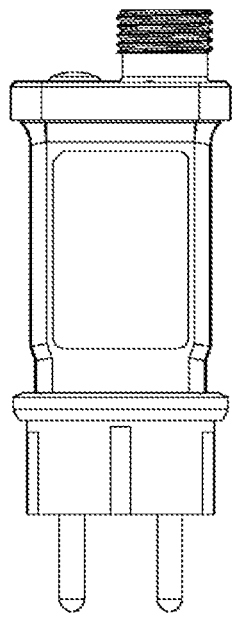
FIG. 20a to FIG. 20g are respectively orthographic views and solid diagrams of six surfaces of an appearance of a tenth lamp controller.
Figure 20B:
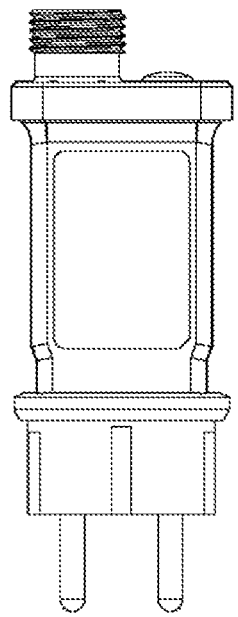
Figure 20E:
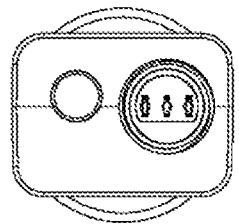
Figure 20F:
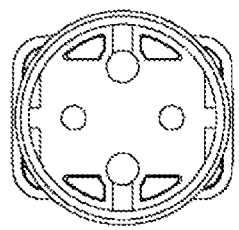
Figure 20C:
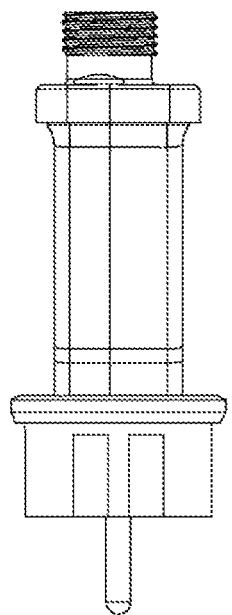
Figure 20D:
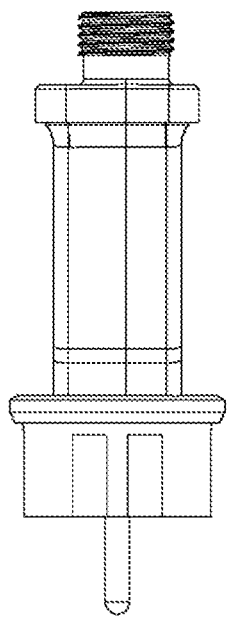
Figure 20G:
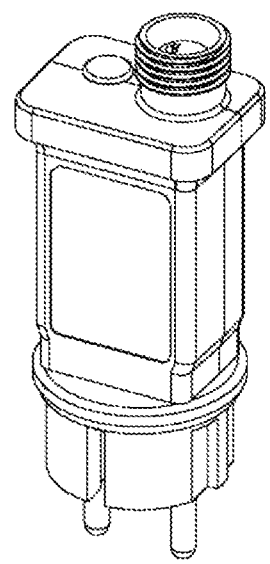
Figure 21A:
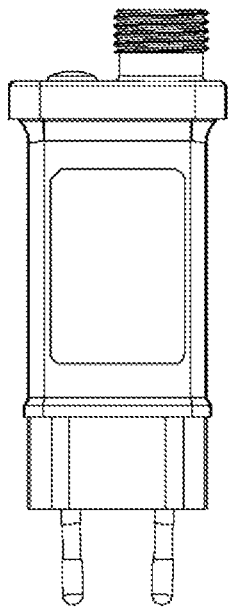
FIG. 21a to FIG. 21g are respectively orthographic views and solid diagrams of six surfaces of an appearance of an eleventh lamp controller.
Figure 21B:
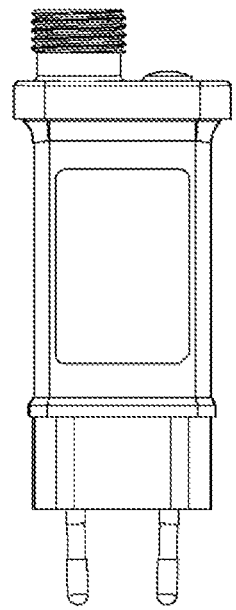
Figure 21E:
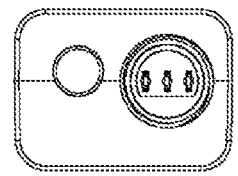
Figure 21F:
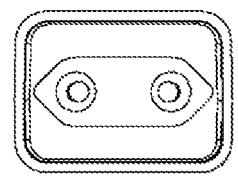
Figure 21C:
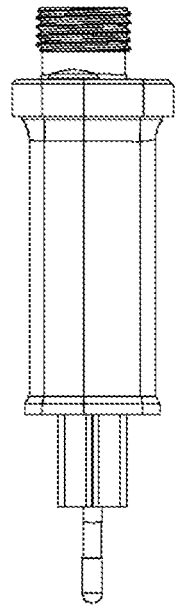
Figure 21D:
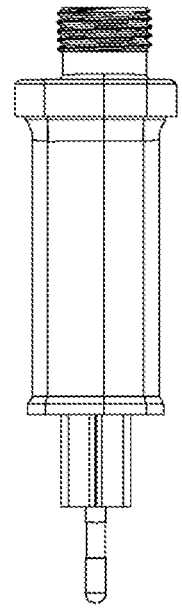
Figure 21G:
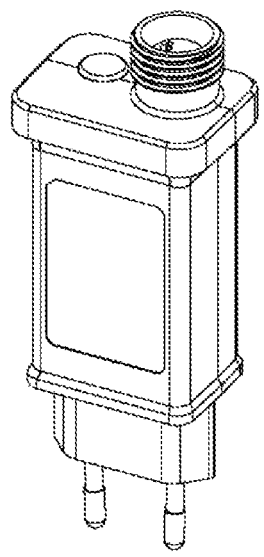
Figure 22A:
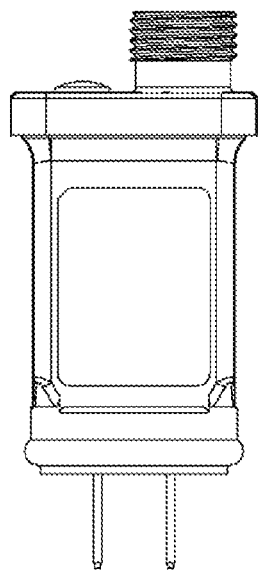
FIG. 22a to FIG. 22g are respectively orthographic views and solid diagrams of six surfaces of an appearance of a twelfth lamp controller.
Figure 22B:
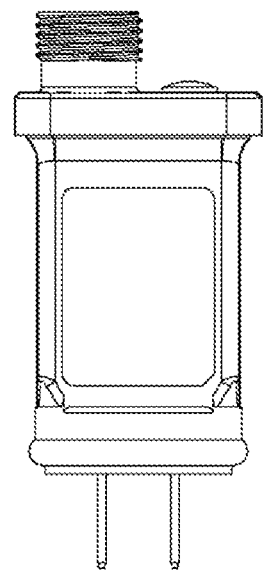
Figure 22C:
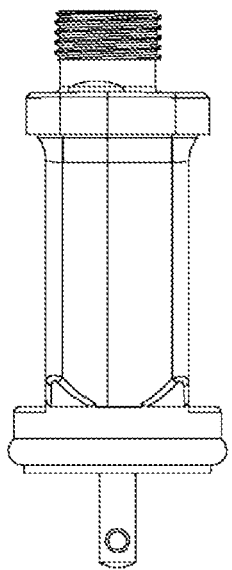
Figure 22D:
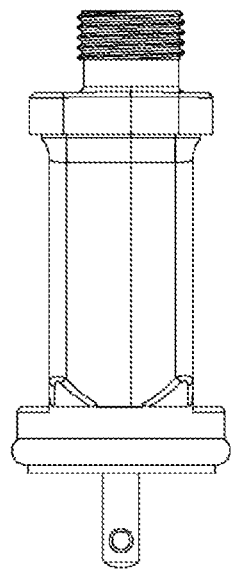
Figure 22E:
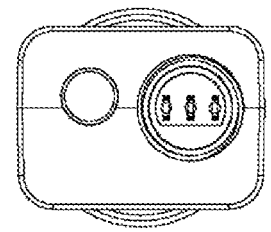
Figure 22F:
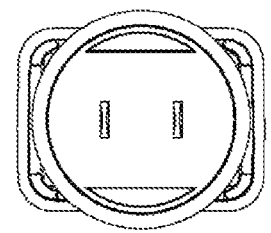
Figure 22G:
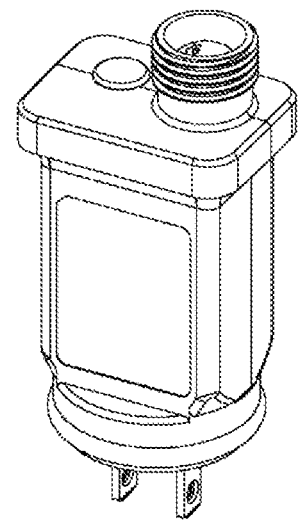
Figure 23A:
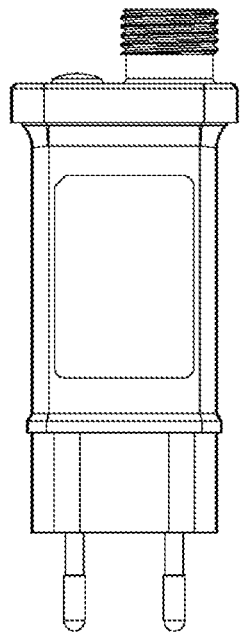
FIG. 23a to FIG. 23g are respectively orthographic views and solid diagrams of six surfaces of an appearance of a thirteenth lamp controller.
Figure 23B:
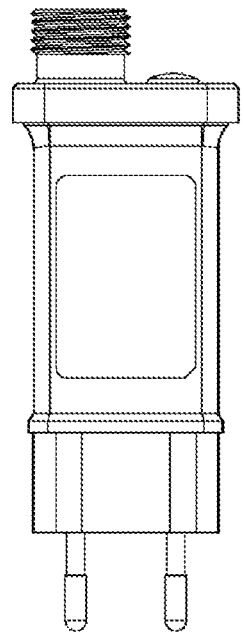
Figure 23E:
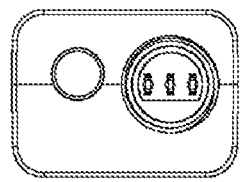
Figure 23F:
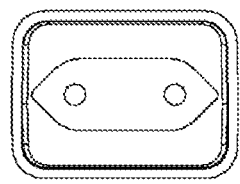
Figure 23C:
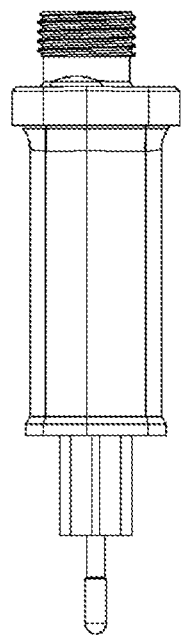
Figure 23D:
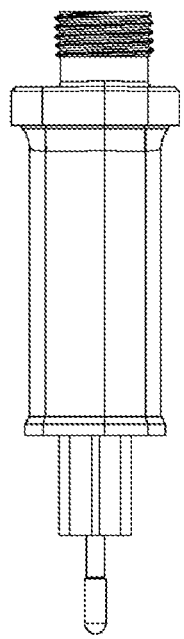
Figure 23G:
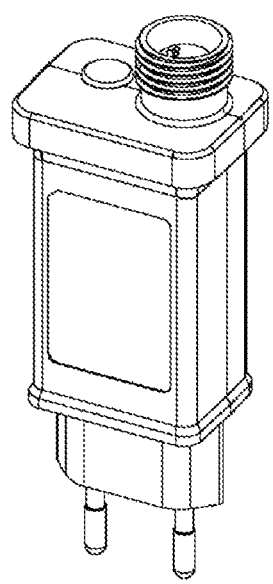
Figure 24A:
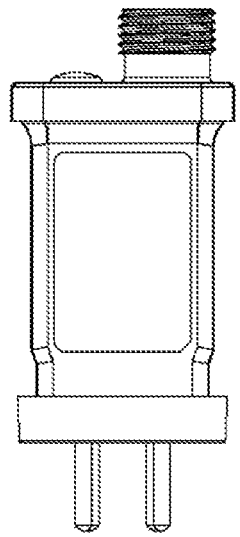
FIG. 24a to FIG. 24g are respectively orthographic views and solid diagrams of six surfaces of an appearance of a fourteenth lamp controller.
Figure 24B:
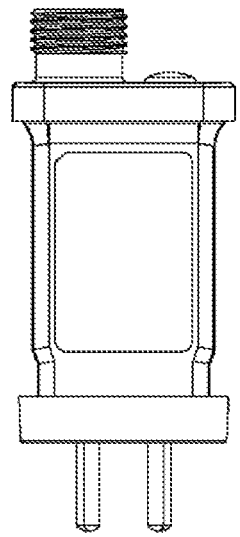
Figure 24E:
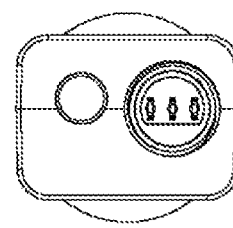
Figure 24F:
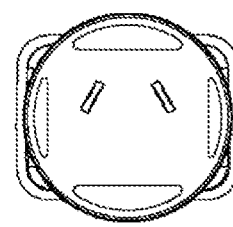
Figure 24C:
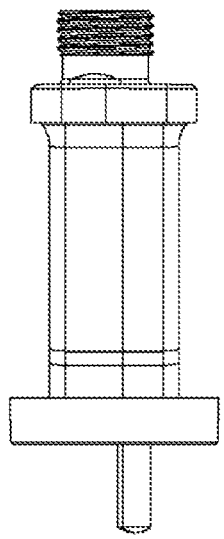
Figure 24D:
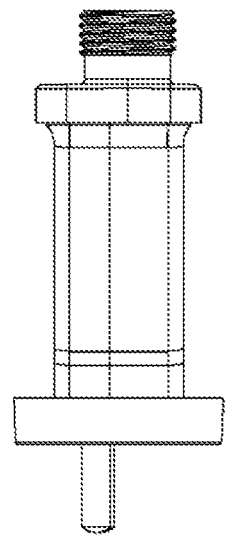
Figure 24G:
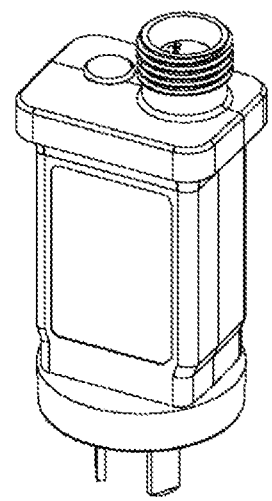
Figure 25A:
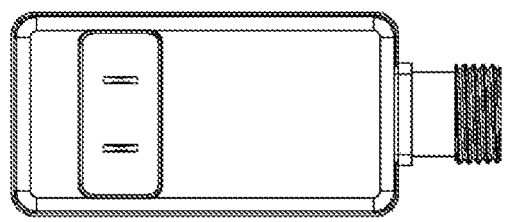
FIG. 25a to FIG. 25f are respectively orthographic views of six surfaces of an appearance of a fifteenth lamp controller.
Figure 25B:
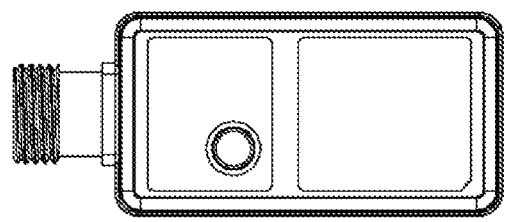
Figure 25C:
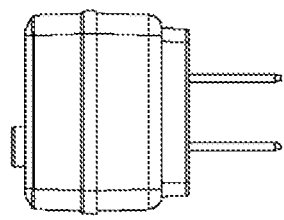
Figure 25D:
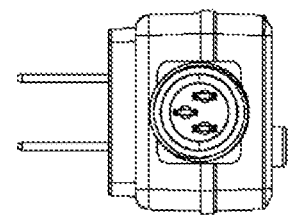
Figure 25E:
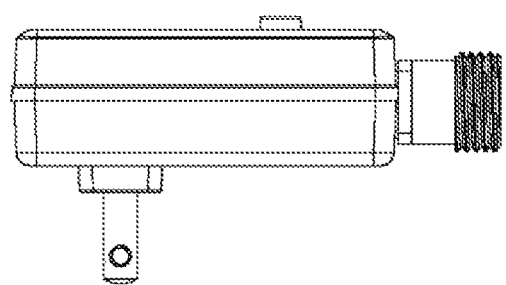
Figure 25F:
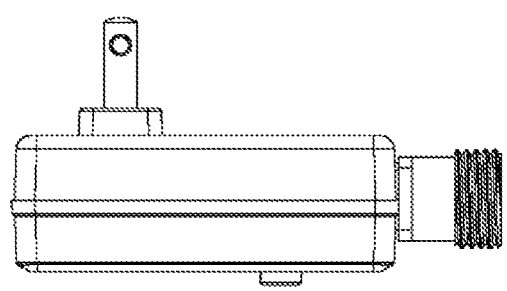
Figure 26A:
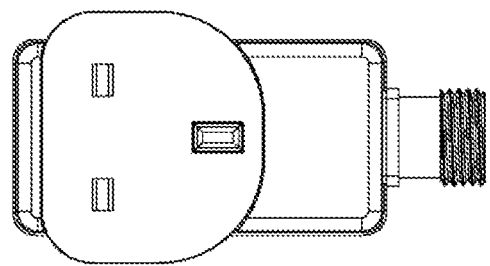
FIG. 26a to FIG. 26f are respectively orthographic views of six surfaces of an appearance of a sixteenth lamp controller.
Figure 26B:
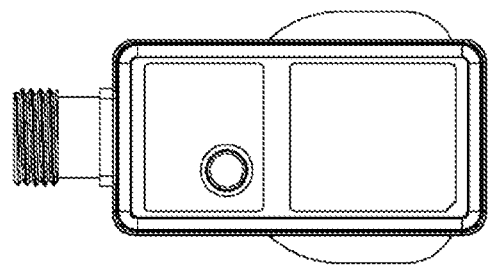
Figure 26C:
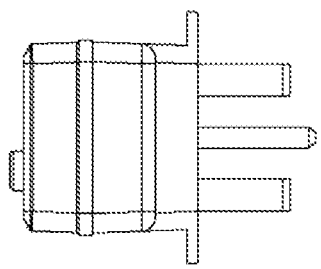
Figure 26D:
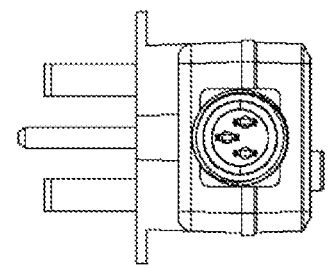
Figure 26E:
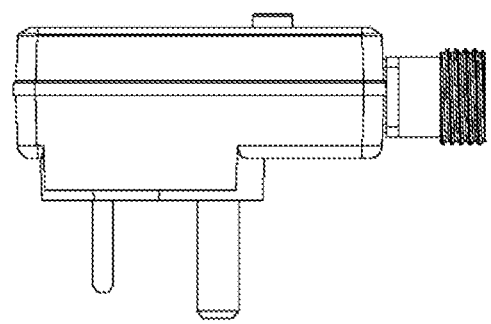
Figure 26F:
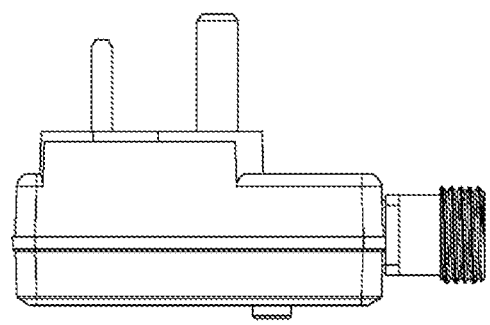
Figure 27A:
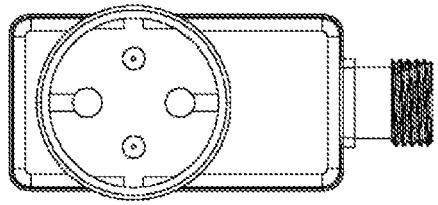
FIG. 27a to FIG. 27f are respectively orthographic views of six surfaces of an appearance of a seventeenth lamp controller.
Figure 27B:
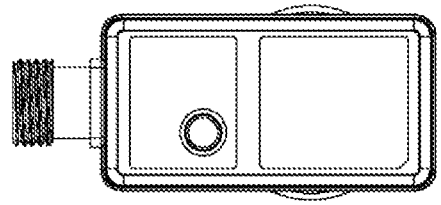
Figure 27C:
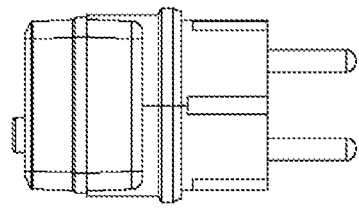
Figure 27D:
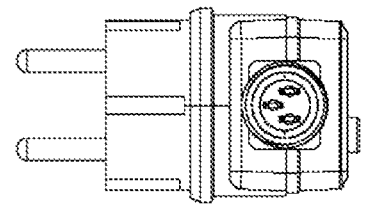
Figure 27E:
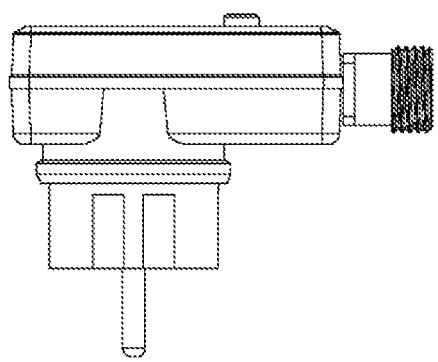
Figure 27F:
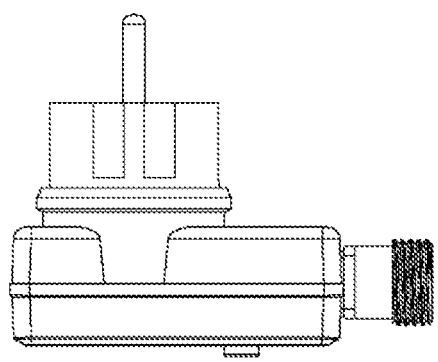
Figure 28A:
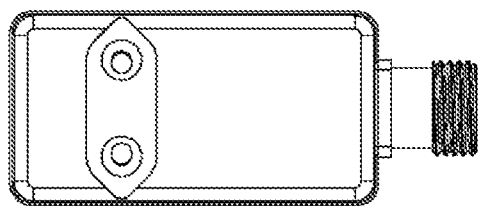
FIG. 28a to FIG. 28f are respectively orthographic views of six surfaces of an appearance of an eighteenth lamp controller.
Figure 28B:
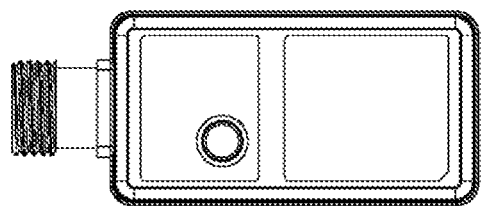
Figure 28C:
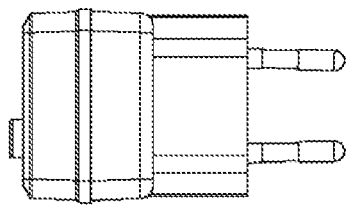
Figure 28D:
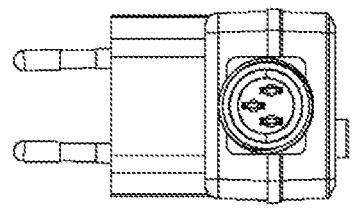
Figure 28E:
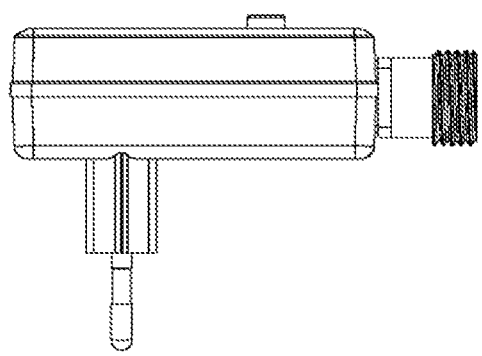
Figure 28F:
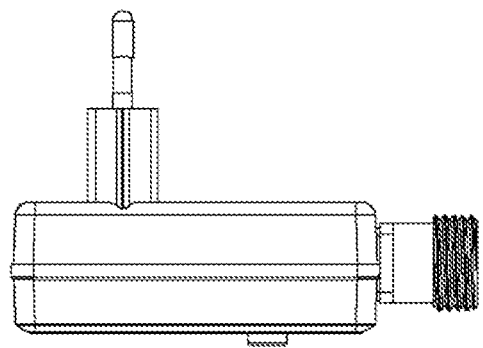
Figure 29A:
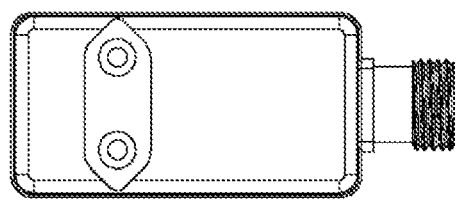
FIG. 29a to FIG. 29f are respectively orthographic views of six surfaces of an appearance of a nineteenth lamp controller.
Figure 29B:
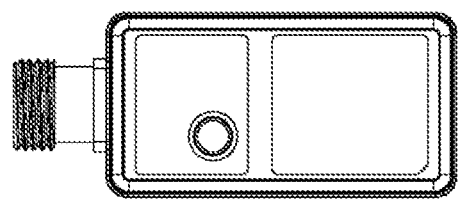
Figure 29C:
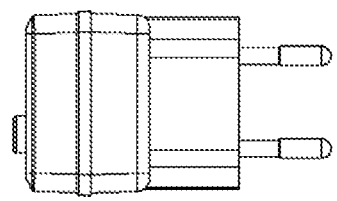
Figure 29D:
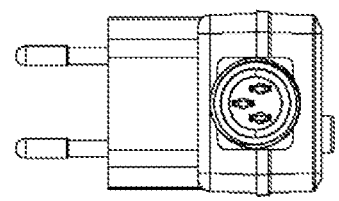
Figure 29E:
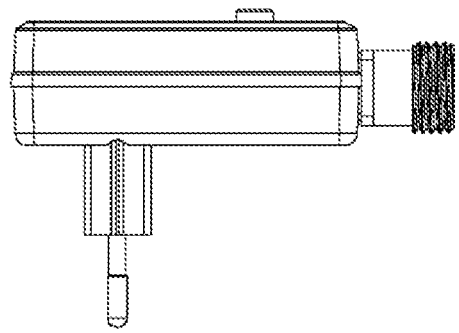
Figure 29F:
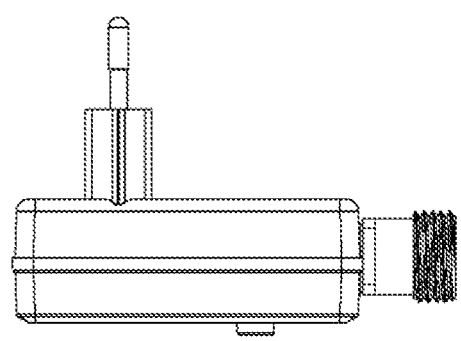
Figure 30A:
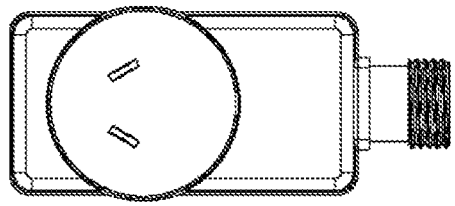
Figure 30B:
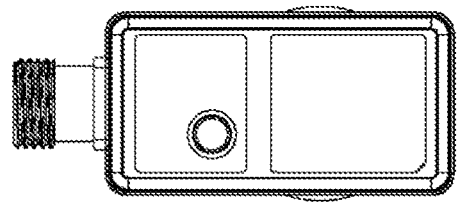
Figure 30C:
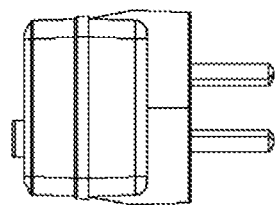
Figure 30D:
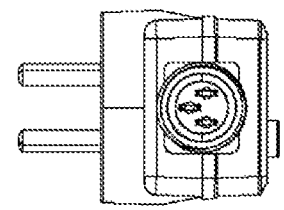
Figure 30E:
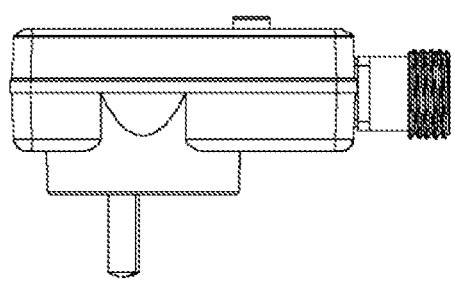
Figure 30F:
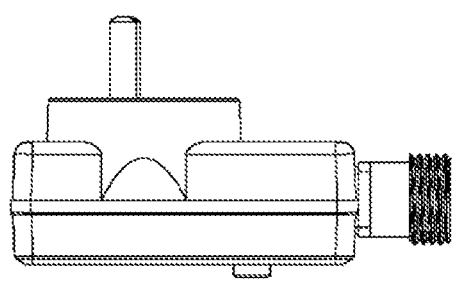
Figure 31A:
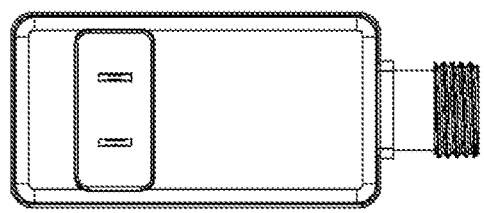
Figure 31B:
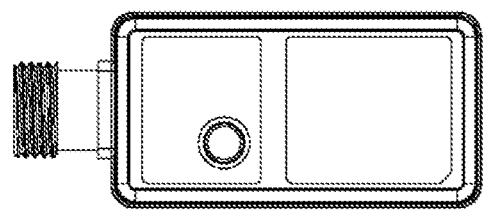
Figure 31C:
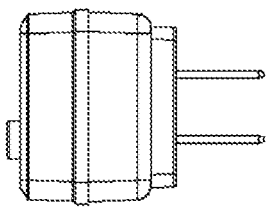
Figure 31D:
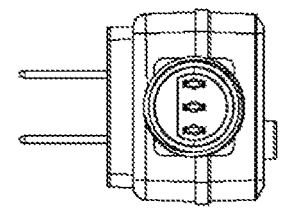
Figure 31E:
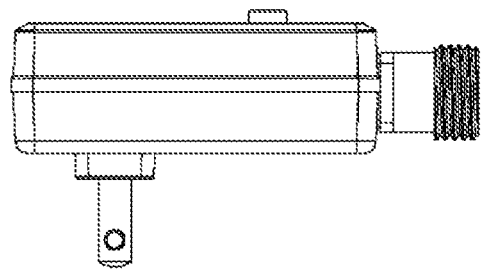
Figure 31F:
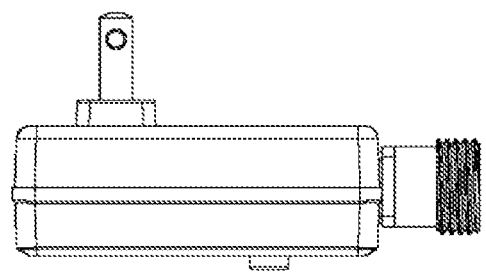
Figure 32A:
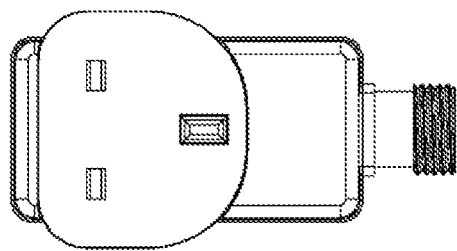
FIG. 32a to FIG. 32f are respectively orthographic views of six surfaces of an appearance of a twenty-second lamp controller.
Figure 32B:
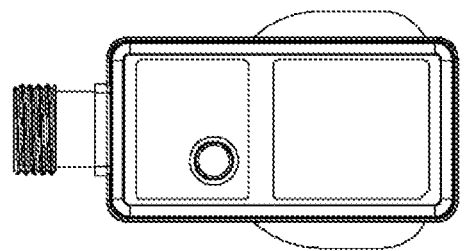
Figure 32C:
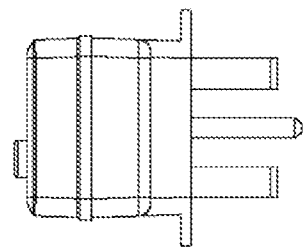
Figure 32D:
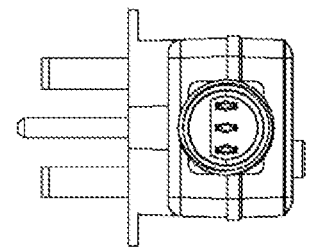
Figure 32E:
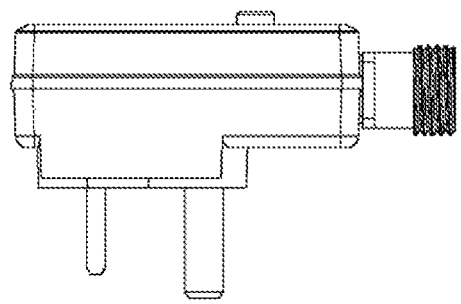
Figure 32F:
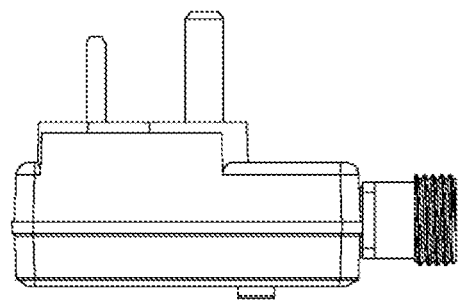
Figure 33A:
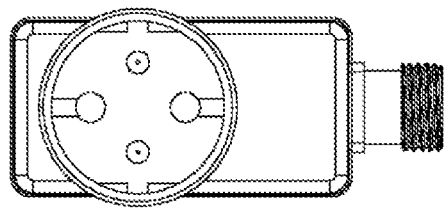
FIG. 33a to FIG. 33f are respectively orthographic views of six surfaces of an appearance of a twenty-third lamp controller.
Figure 33B:
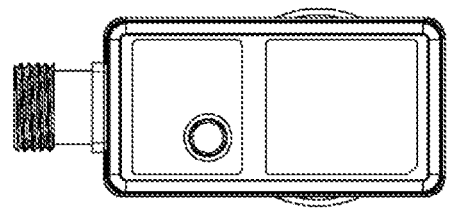
Figure 33C:
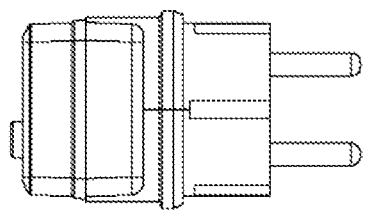
Figure 33D:
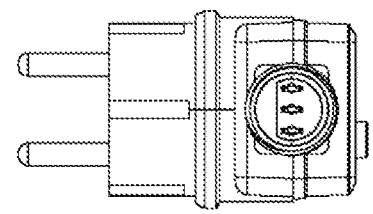
Figure 33E:
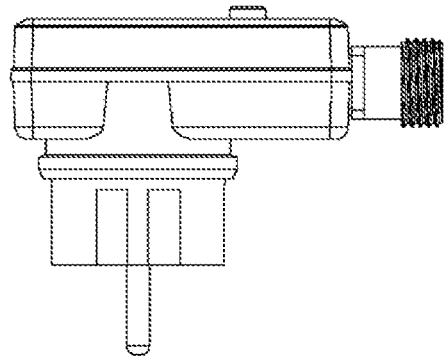
Figure 33F:
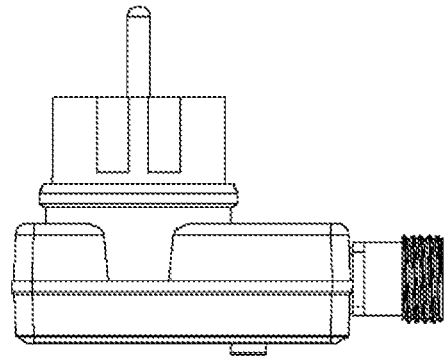
Figure 34A:
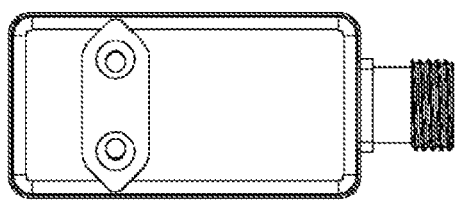
FIG. 34a to FIG. 34f are respectively orthographic views of six surfaces of an appearance of a twenty-fourth lamp controller.
Figure 34B:
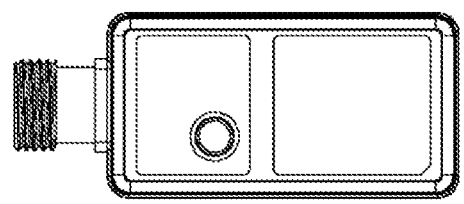
Figure 34C:
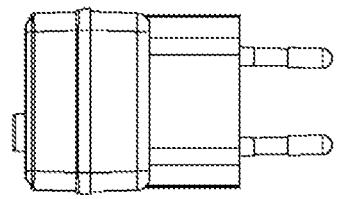
Figure 34D:
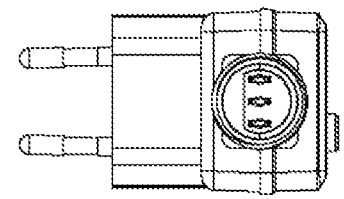
Figure 34E:
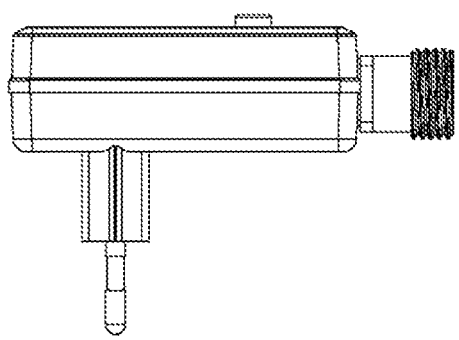
Figure 34F:
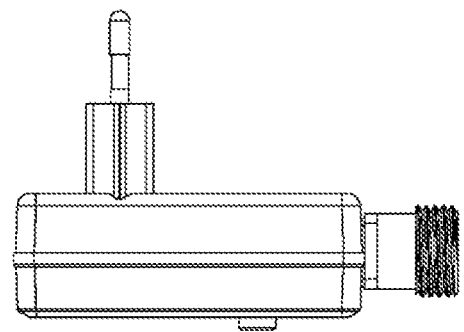
Figure 35A:
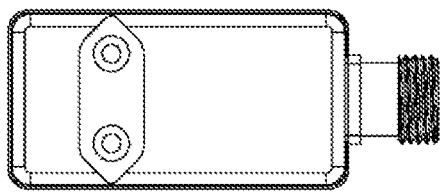
FIG. 35a to FIG. 35f are respectively orthographic views of six surfaces of an appearance of a twenty-fifth lamp controller.
Figure 35B:
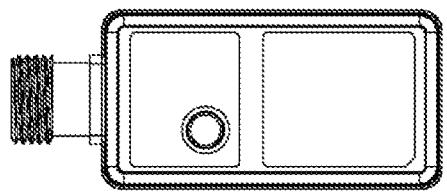
Figure 35C:
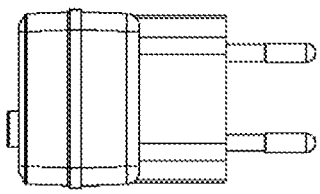
Figure 35D:
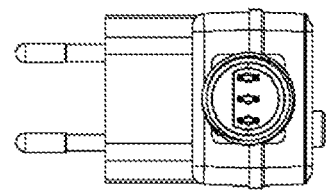
Figure 35E:
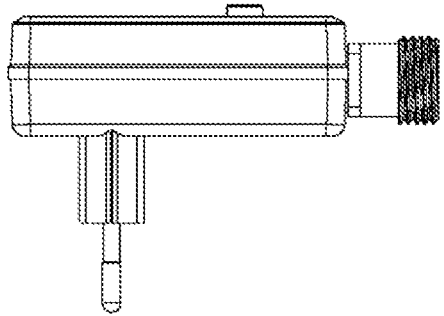
Figure 35F:
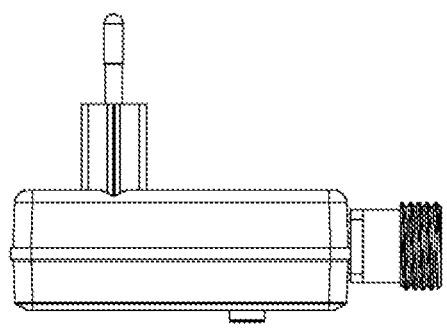
Figure 36A:
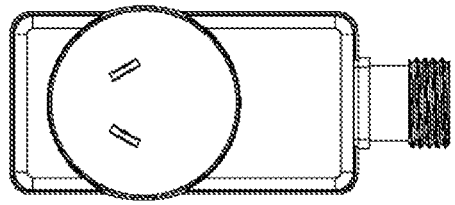
FIG. 36a to FIG. 36f are respectively orthographic views of six surfaces of an appearance of a twenty-sixth lamp controller.
Figure 36B:
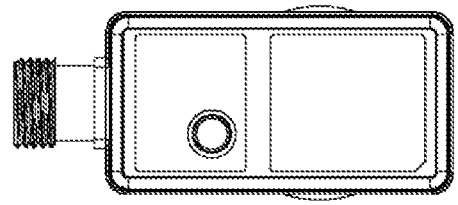
Figure 36C:
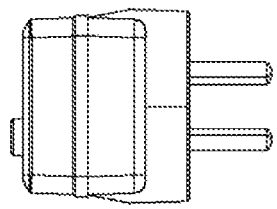
Figure 36D:
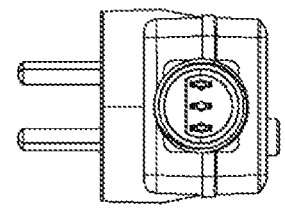
Figure 36E:
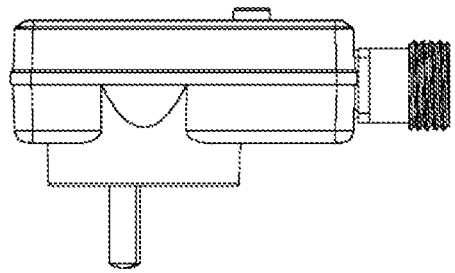
Figure 36F:
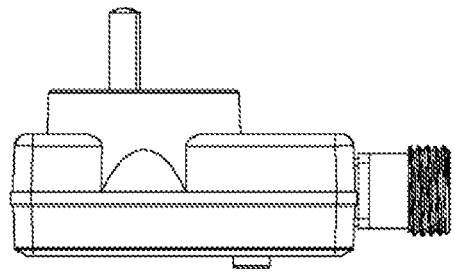
Figure 37A:
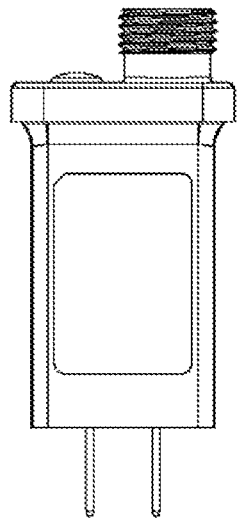
FIG. 37a to FIG. 37f are respectively orthographic views of six surfaces of an appearance of a twenty-seventh lamp controller.
Figure 37B:
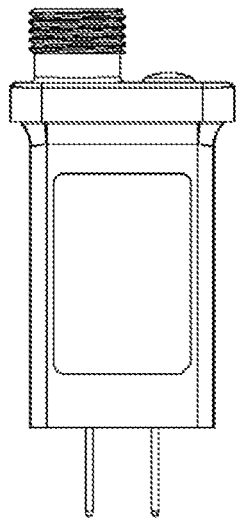
Figure 37E:
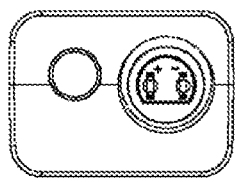
Figure 37C:
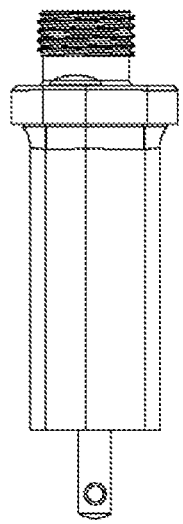
Figure 37D:
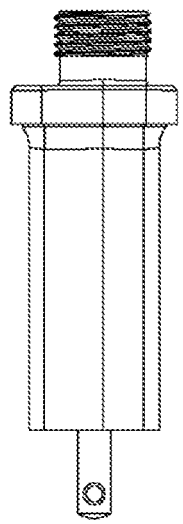
Figure 37F:
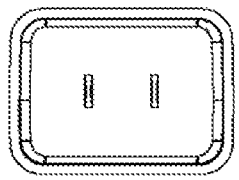
Figure 39A:
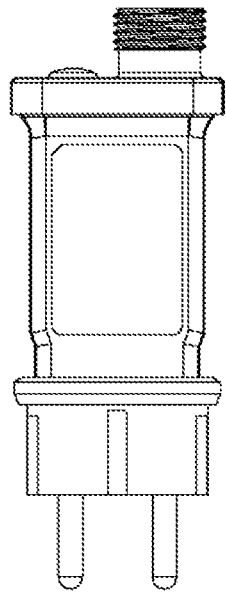
FIG. 39a to FIG. 39f are respectively orthographic views of six surfaces of an appearance of a twenty-ninth lamp controller.
Figure 39B:
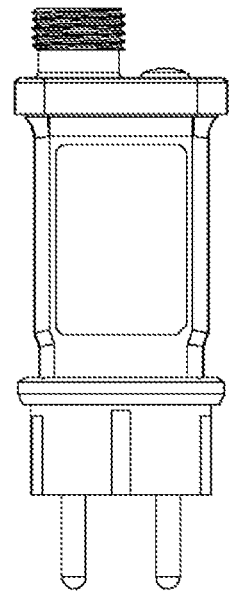
Figure 39E:
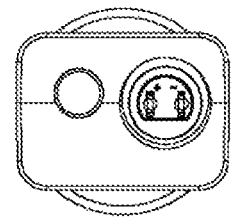
Figure 39C:
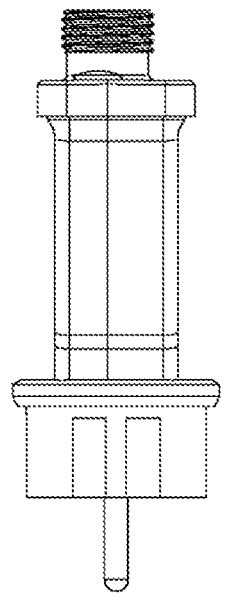
Figure 39D:
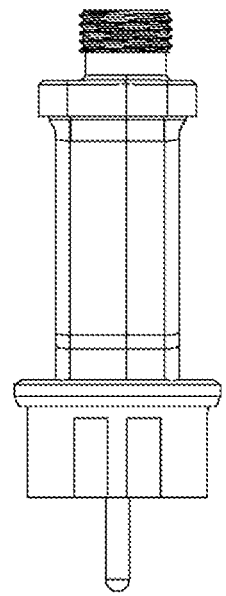
Figure 39F:
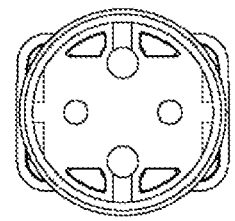
Figure 40A:
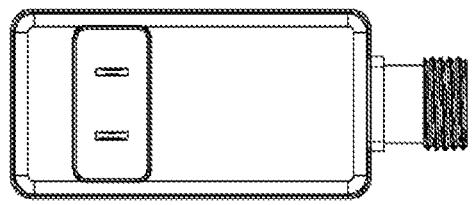
FIG. 40a to FIG. 40f are respectively orthographic views of six surfaces of an appearance of a thirtieth lamp controller.
Figure 40B:
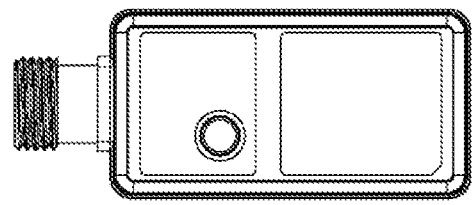
Figure 40C:
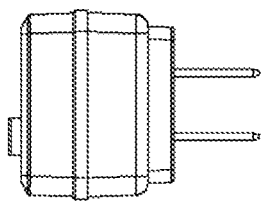
Figure 40D:
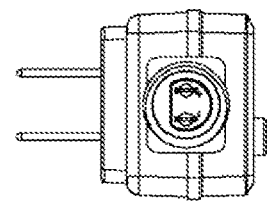
Figure 40E:
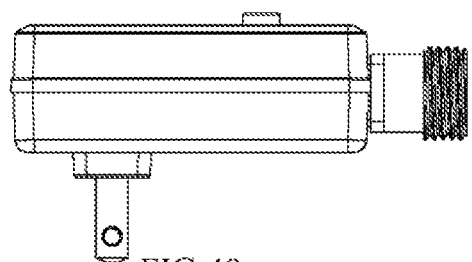
Figure 40F:
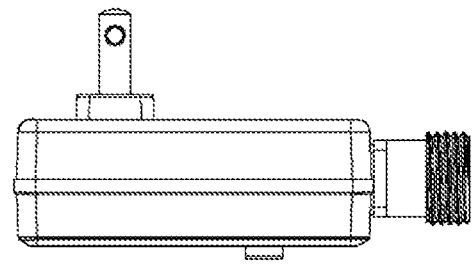
Figure 41A:
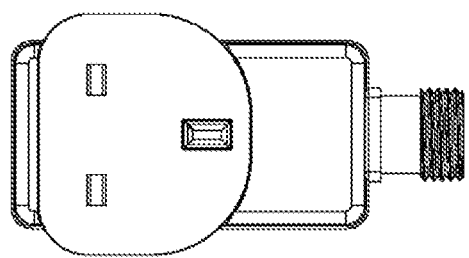
FIG. 41a to FIG. 41f are respectively orthographic views of six surfaces of an appearance of a thirty-first lamp controller.
Figure 41B:
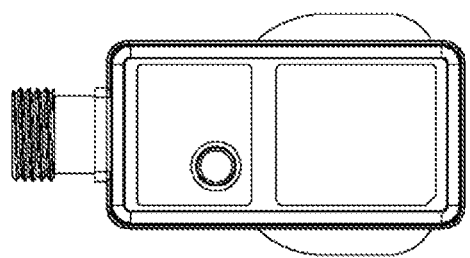
Figure 41C:
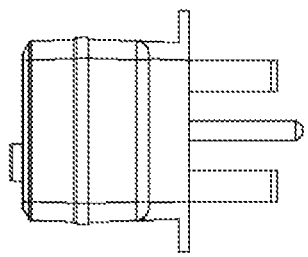
Figure 41D:
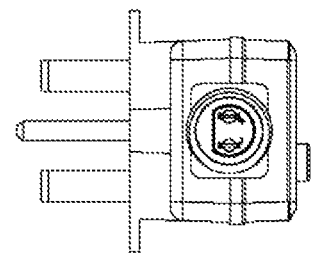
Figure 41E:
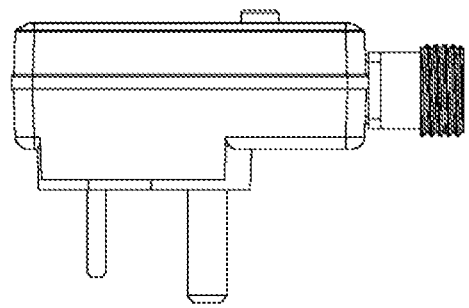
Figure 41F:
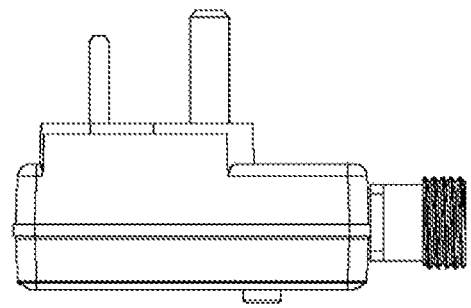
Figure 42A:
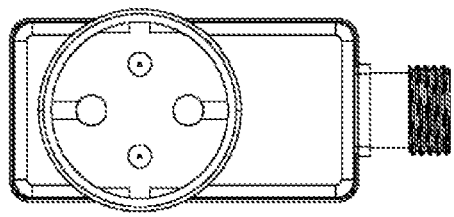
FIG. 42a to FIG. 42f are respectively orthographic views of six surfaces of an appearance of a thirty-second lamp controller.
Figure 42B:
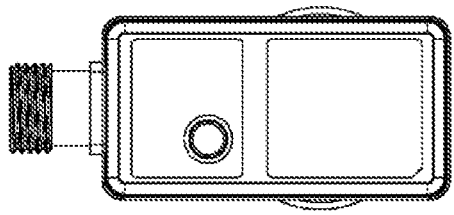
Figure 42C:
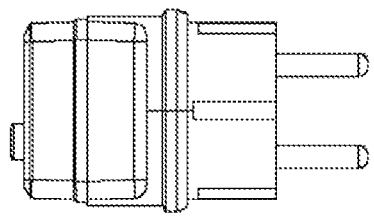
Figure 42D:
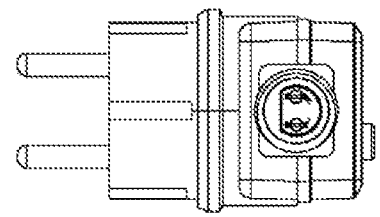
Figure 42E:
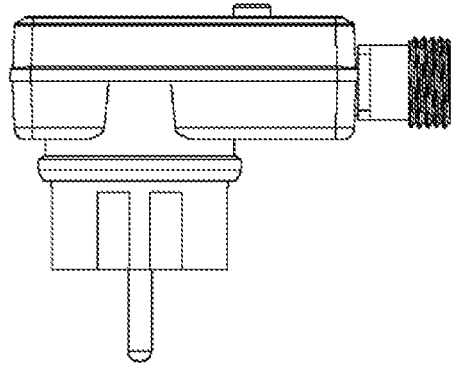
Figure 42F:
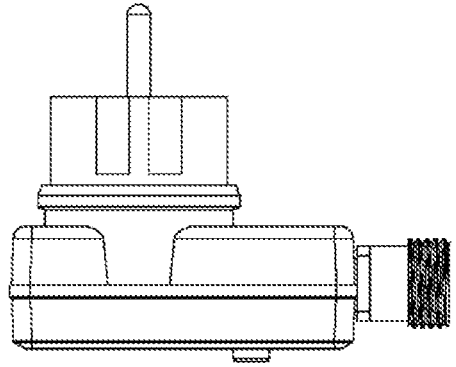

As shown in FIG. 7, this embodiment further provides a control method for a lamp, including the following steps:

S1: after being powered on, the control unit 22 outputs a control signal, and the control unit 22 receives a switching signal input by the mode selector; if a memory chip U3 is available in the controller, the memory chip U3 will record the control signal with a light-emitting mode output by the current control unit 22 after power failure of the last working; and after next power-on, the control unit 22 reads the control signal with the light-emitting mode output last time from the memory chip U3, and the control signal with the light-emitting mode is output after power-on. If the memory chip U3 is not available in the controller, the control unit 22 will output a light-emitting mode according to program setting. The mode selector is the key switch SW or the touch switch connected to the control unit 22, and the mode selector may also adopt the wireless signal transmitter.

S2: if the control unit 22 judges the switching signal input by the mode selector as the light flashing mode switching signal, the control unit 22 outputs the control signal for switching the flashing mode to the switch unit 23, and the control signal for switching the flashing mode controls the sequence to turn on or turn off the switch unit 23.

In S2, the basis that the control unit 22 judges the switching signal input by the mode selector as the light flashing mode switching signal is as follows: the mode selector is pressed once, and the pressing time is less than or equal to first time set by the control unit 22. For example, the single pressing time does not exceed one second. The key switch SW or the touch switch is turned on or turned off by pressing, the preferred way is that the key switch SW or the touch switch is turned on, therefore the single pressing time does not exceed one second, meaning that the time for turning on the key switch SW or the touch switch does not exceed one second when pressing once.

A plurality of selection buttons are arranged on the wireless signal transmitter, the wireless signal transmitter can send out a corresponding coded signal after operating each selection button, the coded signal corresponding to each button is inconsistent, the control unit 22 compares the received coded signals with the coded signal, so as to identify the specific mode corresponding to the coded signals, for example, the flashing mode or timing mode of the lamp 23a.

If the wireless coded signal for switching the flashing mode is output by the wireless signal transmitter, the control unit 22 outputs the control signal for changing the flashing mode of the lamp 23a after receiving and identifying the wireless coded signal for switching the flashing mode sent by the wireless signal transmitter through the wireless signal receiver U4.

S3: if the control unit 22 judges the switching signal input by the mode selector as the light timing signal, the control unit 22 controls the operation for outputting and timing the control signal according to the input of the mode selector, and when the timing is end, the control unit 22 stops outputting the control signal; and at this time, the lamp is extinguished.

In S3, the basis that the control unit 22 judges the switching signal input by the mode selector as the light timing signal is as follows: the mode selector is pressed for several times in second time set by the control unit 22; for example, the key switch SW or the touch switch is pressed continuously twice within one second, namely, the second time is within one second. Therefore, the control unit 22 acquires two continuous signals for turning on the mode selector within one second, so as to judge that user makes the lamp enter the working mode of timing through the mode selector.

In S3, the basis that the control unit 22 judges the switching signal input by the mode selector as the light timing signal may also be: the time for continuously pressing the model selector is greater than or equal to third time set by the control unit 22, for example, the time for continuously pressing the key switch SW is greater than two seconds, namely, the third time is greater than two seconds.

After entering the timing mode, if the control unit 22 further receives a light flashing mode switching signal, the flashing mode is switched according to the way in S2 under the timing mode.

After entering the timing mode in a case that the mode selector adopts the key switch SW or the touch switch, if the control unit 22 receives the switching signal input by the mode selector again as the light timing signal, the timing is turned off.

If the timing mode is selected in a wireless manner, the control unit 22 receives the code for timing sent by the wireless signal transmitter through the wireless signal receiver U4, for example, the control unit 22 is used for starting timing after acquiring a second code and setting the time of the timing work, for example, the lamp 23a is extinguished after working for six hours. Certainly, a plurality of codes for timing may be sent through the wireless signal transmitter, for example, the wireless signal transmitter may also send a third code for timing, and the third code for timing enables the lamp 23a to be extinguished after working for eight hours. The control unit 22 starts timing after being used for the timing code, and the control unit 22 turns off timing after receiving the code signal for cancelling the timing.

When FIG. 5 or FIG. 6 is connected to any one of FIG. 11a to FIG. 36f, or FIG. 8 to FIG. 10 is any one control unit and switch unit in the FIG. 37a to FIG. 42f, the control of the controller for each lamp is applicable to the above method.

The control method of the disclosure is not limited to the above embodiments, for example:
- (a) In S2, the basis that the control unit 22 judges the switching signal input by the mode selector as the light timing signal is as follows: the mode selector is pressed for several times in the second time set by the control unit 22; for example, the key switch SW or the touch switch is pressed continuously twice within one second.
- (b) In S2, the basis that the control unit 22 judges the switching signal input by the mode selector as the light flashing mode switching signal is as follows: the time for continuously pressing the model selector is greater than or equal to the third time set by the control unit 22, for example, the time for continuously pressing the key switch SW is greater than two seconds.
- (c) In S3, the basis that the control unit 22 judges the switching signal input by the mode selector as the light timing signal is as follows: the mode selector is pressed once, and the pressing time is less than or equal to the first time set by the control unit 22. For example, the pressing time does not exceed one second.

The above control method is based on the fact that the controller can respectively switch the light flashing mode switching signal and the light timing signal. Some controllers only need to switch the light timing, the light flashing mode is automatically achieved by the program, so switching is not required. For example, if eight flashing modes are available, the signal is output and circulated in turn according to the eight flashing modes after power-on. For this controller, the present disclosure further configures the following control method:

After power-on, the control unit 22 outputs the control signal which enables the lamp to work, and the control signal has the eight inherent circular flashing modes illustrated above. If the control unit 22 receives the timing switching signal sent by the model selector, the control unit 22 switches the operation for outputting and timing the control signal according to the input of the mode selector, and when the timing is end, the control unit 22 stops outputting the control signal.

The mode selector is the key switch SW or the touch switch connected to the control unit 22, the basis that the control unit 22 judges the timing switching signal sent by the mode selector is as follows: the mode selector is pressed once, and the pressing time is less than or equal to the first time set by the control unit 22, for example, the first time is within one second; or the mode selector is pressed for several times within the second time set by the control unit 22, for example, the key switch SW or the touch switch is continuously pressed twice within one second. Or the time for continuously pressing the model selector is greater than or equal to the third time set by the control unit 22, and the time for continuously pressing the key switch SW is greater than two seconds.

Regardless of the working mode after power-on or the working mode entering the timing, the light brightness or the switch controller may also be switched by operating the key switch SW or the touch switch, for example, the mode selector is pressed once, and the pressing time is less than or equal to the first time set by the control unit 22, for example, the first time is within one second; or the mode selector is pressed for several times within the second time set by the control unit 22, for example, the key switch SW or the touch switch is continuously pressed twice within one second. Or the time for continuously pressing the model selector is greater than or equal to the third time set by the control unit 22, and the time for continuously pressing the key switch SW is greater than two seconds. For another example, the controller is turned on or turned off when the time for continuously pressing the mode selector is greater than or equal to the third time set by the control unit 22.

The operation for the timing mode and the operation for switching the light brightness are achieved by operating the same key switch, but the signal sending mode is different. For example, when switching the brightness by pressing the mode selector once within the first time, the mode selector is pressed for several times within the second time set by the control unit 22, so as to enter or exit the timing mode, namely, the operations of timing, dimming and turning on/off the controller are not overlapped.

Certainly, all the above operations may also adopt two key switches SW or two touch switches, one key switch SW or touch switch is used for switching the light brightness or turning on/off the controller, and the other key switch SW or touch switch is used for entering or exiting the timing.

What is claimed is:

1. A lamp power adapter, comprising an input conductive component (1), a shell (2), a circuit board (3), an end cover (4) and a connecting base (5) for connecting load; one end of the input conductive component (1) is located in the shell (2), the input conductive component (1) is integrally fixed with the shell (2), the other end of the input conductive component (1) is exposed outside the shell (2), an input connecting terminal (6), a control circuit (7) and an output connecting terminal are arranged on the circuit board (3), at least a part of the circuit board (3) is located in the shell (2), the input connecting terminal (6) is electrically connected to one end of the input conductive component (1), the connecting base (5) is arranged on the end cover (4), an output conductive component is arranged on the connecting base (5), when the end cover (4) fits with the shell (2), the output conductive component is in plugging fit with the output connecting terminal, wherein the output connecting terminal comprises a first output connecting terminal (8a), a second output connecting terminal (8b) and a third output connecting terminal (8c), and the output conductive component comprises a first conductive component (9a) plugged with the first output connecting terminal (8a), a second conductive component (9b) plugged with the second output connecting terminal (8b) and a third conductive component (9c) plugged with the third output connecting terminal (8c), wherein:

the first output connecting terminal (8a), the second output connecting terminal (8b) and the third output connecting terminal (8c) are arranged side by side; or the first output connecting terminal (8a) is misaligned with the second output connecting terminal (8b), and the second output connecting terminal (8b) is misaligned with the third output connecting terminal (8c);

the first output connecting terminal (8a), the second output connecting terminal (8b) and the third output connecting terminal (8c) comprise:

conductive bodies (8d) with openings, wherein abdicating openings (8e) are arranged on the conductive bodies (8d);

welding pins (8f), which are fixed with the conductive bodies (8d); and two symmetrically arranged clamping sheets for clamping the output conductive components, the two clamping sheets comprise first bending parts (8g), second bending parts (8h) and clamping parts (8i), one end of each first bending part (8g) is located in each abdicating opening (8e) and fixed with each conductive body (8d); after the other end of each first bending part (8g) is fixed with one end of each second bending part (8h), an inserting import opening (8j) is formed between the two second bending parts (8h); and the other end of each second bending part (8h) is fixed with each clamping part (8i).

2. The lamp power adapter according to claim 1, wherein a bending direction of each first bending part (8g) is opposite to that of each second bending part (8h).

3. The lamp power adapter according to claim 1, wherein two ribs (10) are respectively arranged on two opposite inner walls of the shell (1), a slot (11) is formed between the two ribs (10), and the length of each rib (10) is less than or equal to that of the circuit board (3).

4. The lamp power adapter according to claim 3, wherein a chamfer (10a) is arranged at the end part of each rib (10) corresponding to the entrance of the slot (11).

5. The lamp power adapter according to claim 3, wherein a supporting part (1a) for supporting the circuit board (3) is arranged on the inner wall of the shell (1).

6. The lamp power adapter according to claim 4, wherein the chamber (10a) is a round corner or an oblique corner.

7. The lamp power adapter according to claim 1, wherein the control circuit (7) comprises a DC power supply (21), a control unit (22) and a switch unit (23), an output end of the DC power supply (21) is electrically connected to the switch unit (23), and the control unit (22) is electrically connected to the switch unit (23); and the switch unit (23) comprises a first switch set, a second switch set and a control module (U1A) for controlling the first switch set and the second switch set to be turned on alternately, an output end of the control module (U1A) is electrically connected to the first switch set, and the output end of the control module (U1A) forms a second set of switch circuit after being electrically connected to the second switch set;

the switch unit (3) further comprises:

a first toggle switch (Q31), which forms a first set of switch circuit after being electrically connected to an output end of the first switch set and the control unit (22) in respective; and a second toggle switch (Q32), which forms a third set of switch circuit after being electrically connected to the output end of the first switch set and the control unit (22) in respective.

\* \* \* \* \*